US008675892B2

(12) United States Patent
Hogue et al.

(10) Patent No.: US 8,675,892 B2
(45) Date of Patent: Mar. 18, 2014

(54) SPECTRAL MANAGEMENT SYSTEM

(75) Inventors: Douglas K. Hogue, Farmington Hills, MI (US); Ryan J. Mihelich, Farmington Hills, MI (US); Jeffrey Tackett, Allen Park, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 992 days.

(21) Appl. No.: 12/771,790

(22) Filed: Apr. 30, 2010

(65) Prior Publication Data

US 2010/0278346 A1 Nov. 4, 2010

Related U.S. Application Data

(60) Provisional application No. 61/174,837, filed on May 1, 2009.

(51) Int. Cl.
*H03G 5/00* (2006.01)

(52) U.S. Cl.
USPC ................................ 381/99; 381/98; 381/103

(58) Field of Classification Search
USPC ........................................ 381/61, 98–99, 103
See application file for complete search history.

(56) References Cited

U.S. PATENT DOCUMENTS 5,841,879 A 11/1998 Scofield et al. ............... 381/309
6,606,388 B1 8/2003 Townsend et al. .............. 381/17
7,298,852 B2 * 11/2007 Croft, III ......................... 381/56
2002/0186854 A1 12/2002 Hosoi et al. ..................... 381/99
2004/0086128 A1 5/2004 Risch et al. ....................... 381/1
2005/0271215 A1 * 12/2005 Kulkarni ......................... 381/18
2007/0058816 A1 3/2007 Ko ................................... 381/1

FOREIGN PATENT DOCUMENTS

WO WO 00/15003 3/2000

OTHER PUBLICATIONS

International Search Report and Written Opinion dated Aug. 23, 2010, in corresponding International Application No. PCT/US2010/033230, filed Apr. 3, 2010. (13 pgs.).

* cited by examiner

*Primary Examiner* — Disler Paul
(74) *Attorney, Agent, or Firm* — Brooks Kushman P.C.

(57) ABSTRACT

A spectral management system may be used in an audio system to receive and process audio signals having multiple distributed audio channels, such as a right, left, center, right side, left side, right rear and left rear channels. The spectral management system may separate and route a frequency range of audio content included in one or more of the distributed audio channels to other distributed audio channels. The separated and routed frequency range of audio content may be combined with audio content present on the other distributed audio channels to which the separated frequency range of audio content is routed. Separation, routing and combination may include bass audio content routing, mid-bass audio content routing, subwoofer audio content routing and treble audio content routing.

31 Claims, 16 Drawing Sheets

SPECTRAL MANAGEMENT SYSTEM

PRIORITY CLAIM

This application claims priority to U.S. Provisional Patent Application No. 61/174,837, filed on May 1, 2009 titled “Spectral Management”, by Douglas K. Hogue, Ryan J. Mihelich and Jeffrey Tackett, which is incorporated by reference herein.

BACKGROUND OF THE INVENTION

1. Technical Field

This invention relates, in general, to audio systems and, in particular, to the spectral management of audio signals generated by an audio system.

2. Related Art

Audio/video systems, such as a home entertainment system or a vehicle entertainment system, have progressed well beyond AM/FM compact disk players with only two or four speakers and two channel audio signals. Presently vehicle audio systems are more like home entertainment centers with satellite receivers and compact disc (CD)/digital video disc (DVD) players with five or more speaker locations. Similarly, home audio/video systems have progressed from two channel stereo systems to surround sound audio systems, such as 7.1 surround sound audio systems.

Unlike prior audio or audio/video systems that used a single input audio signal or channel (commonly called “mono” audio), present day audio/video systems typically make use of two input audio signals or channels (left and right audio signals) when reproducing recorded or transmitted sounds. The two audio signals are processed and surround sound audio signals are created by applying signal processing to the two audio signals to generate a higher number of output audio signals. Each of the newly created audio signals may be a broadband signal but not reproduced by a broadband loudspeaker.

Thus, there is a need for spectral management in audio systems that take speaker transducer characteristics into consideration when dividing and routing the frequencies of input audio signals.

SUMMARY

A spectral management system in an audio system may receive and process a multi-channel audio input signal. The spectral management system may process audio content included on distributed audio channels included in the audio signal. The audio content on one or more of the distributed audio channels may be separated into a low frequency part and a high frequency part based on a predetermined tunable center frequency in a frequency bank. The separated high frequency part or the separated low frequency part of a distributed audio content may be routed to one or more other distributed audio channels. The routed high frequency part or low frequency part may be combined with audio content present on the one more other audio channels. The resulting distributed audio channels are adapted distributed audio channels having re-arranged audio content adapted for the audio system. The separation, routing and combination of the high or low frequency parts of the audio content on the distributed audio channels may occur without loss of audio content from the audio signal or addition of audio content to the audio signal, while providing audio channels with rearranged audio content that is specifically adapted to optimize operation of the audio system.

Based on predetermined settings or operational changeable parameters of the audio system, a high frequency and/or a low frequency range of audio content on a distributed audio channel may be rerouted among one or more other audio channels. Thus, when an audio channel is configured in the audio system to drive loudspeaker(s) that have limited frequency response range, audio content outside the frequency response range of the loudspeaker(s) may be rerouted to one or more other distributed audio channels configured in the audio system to drive loudspeaker(s) that are more suited for reproducing the rerouted frequency range. For example, audio content in a high frequency range on a center channel driving a center loudspeaker may be rerouted from the center channel to left and right channels configured to drive left and right loudspeakers that are more suited for reproducing high frequencies than is the center loudspeaker. The separation, routing and/or combination of the high or low frequency parts of the audio content on the distributed audio channels may optimize desirable audio system operation without loss of audio content from the audio signal or addition of audio content to the audio signal.

The spectral management system may include a bass converter, a distributed channel audio content router, and a subwoofer router for complete spectral management in an example implementation. The distributed channel audio content router may include at least one of a treble router and a bass router. In other implementations, one or two portions of the spectral management system may be implemented. The bass converter may create routed bass audio content from a low frequency part of the audio content on one or more of the audio channels based on a predetermined tunable bass center frequency. The routed bass audio content may be distributed among the distributed audio channels. The bass router may separate out and route the low frequency part of the audio content on one or more of the distributed audio channels to other distributed audio channels based on a predetermined tunable mid-bass center frequency. The treble router may separate out and route the high frequency part of the audio content on one or more of the distributed audio channels to other distributed audio channels based on a predetermined tunable treble center frequency. The subwoofer router may separate out a low frequency portion of the audio content on one or more of the distributed audio channels based on a predetermined tunable subwoofer center frequency and route the low frequency portion to generate a sub channel. The adapted distributed audio channels and the sub channel may be provided as an audio output signal to drive loudspeakers.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
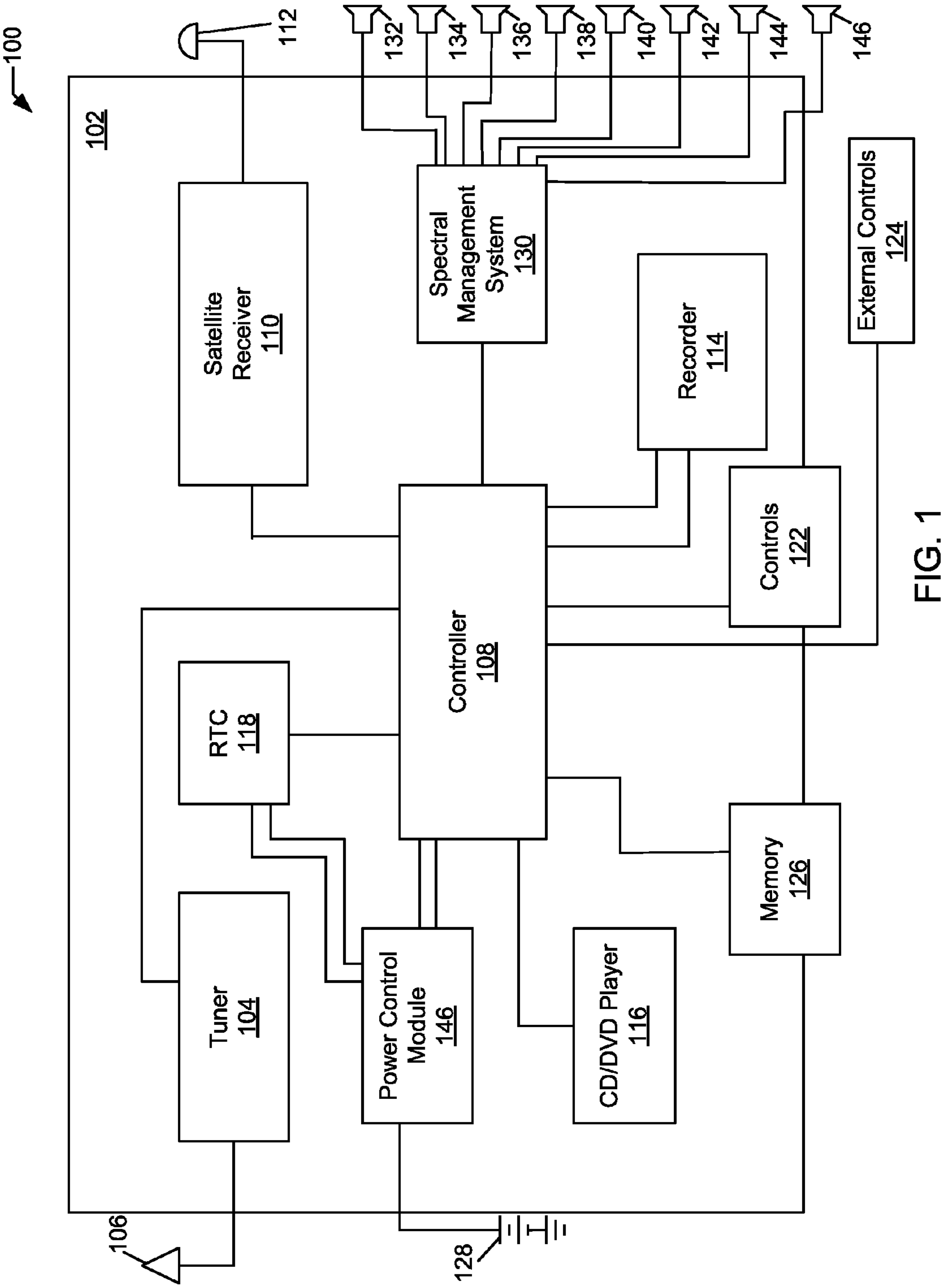
FIG. 1 is a block diagram of an example audio entertainment system (AES).

In the following detailed description of examples of various implementations, it will be understood that any direct connection or coupling between functional blocks, devices, components or other physical or functional units shown in the drawings or description in this application could also be implemented by an indirect connection or coupling. It will also be understood that the features of the various implementations described in this application may be combined with each other, unless specifically noted otherwise.

An audio/video entertainment system (AES) with a digital player may be configured to play audio programs by using controls located on the AES or external controls. The audio/video signal is a general term used to describe an audio/video device or system that can receive audio and/or video signals from an audio/video source at one or more inputs and then further process the audio and/or video signals. Audio/video sources may be pre-recorded multimedia such as digitally stored files, compact discs or digital video discs, live audio/video, or any other source of audio/video signals. In FIG. 1, a block diagram 100 of an AES 102 in accordance with an example implementation of the invention is depicted. The AES 102 may include software, hardware, and/or some combination of hardware and software. The software may be in the form or instructions stored in a memory device. The hardware may include circuitry, electronic components, circuit boards, and any other electronic parts. The AES 102 may include audio/video sources such as a tuner 104 coupled to an AM/FM antenna 106. The tuner 104 may be one or more actual tuners with each tuner being coupled to the AM/FM antenna 106. The tuner 104 may also be coupled to a controller and/or digital signal processor (DSP) 108 or other type of processor or controller that is able to process digital signals. A satellite receiver 110 may also be an audio/video source connected to the DSP 108 and a satellite antenna 112. A recorder or digital player 114 may be another audio/video source operating as a component of the AES 102 and may have control and data lines or busses that connect to DSP 108. A compact disc (CD) and/or digital video disc (DVD) player 116 may also be audio/video sources forming part of the AES 102 and coupled to the DSP 108. Further, a real time clock (RTC) 118 may provide the AES 102 with time indications. The RTC 118 may also be coupled to the DSP 108 and the satellite receiver 110. Controls for configuring and using the AES 102 may be located with the AES 102, such as controls 122 or external to the AES 102, such as external controls 124. In other examples, any other audio/video sources, such as navigation systems, television tuners, mobile telephones, digital content storage devices, wireless connections to the internet or any other source of audio and/or video data content may be included in or connected with the AES 102.

The AES 102 may also have a memory 126 and a power supply or power source 128. The memory 126 may include internal memory, removable memory, or a combination of internal, external, and removable memory. The AES 102 may include one or more components that include software, hardware, and/or some combination of hardware and software. As described herein, the components are defined to include software modules, hardware modules or some combination thereof executable by the controller or processor 108. Software modules may include instructions stored in the memory 126, or other memory device, that are executable by the controller or processor 108 or other processors. Hardware modules may include various devices, components, circuits, gates, circuit boards, and the like that are executable, directed, and/or controlled for performance by the controller or processor 108.

A spectral management system 130 may be component present in the AES 102 that routes signals to a number of different transducers or loudspeakers located within the vehicle, such as right front (RF) speaker 132, left front (LF) speaker 134, center speaker (C) 136, left side (LS) speaker 138, right side (RS) speaker 140, right back (RB) speaker 142, left back (LB) speaker 144, and subwoofer 146. Each loudspeaker in the AES 102 may be optimized for reproducing predetermined frequency ranges. For example, a subwoofer may be optimized for reproducing frequencies below 200 Hz.

The spectral management system 130 may operate based on predetermined settings input and stored in the memory by a user of the AES 102. In addition or alternatively, such predetermined settings may include system configuration parameter settings, system configuration details, such as loudspeaker locations, frequency response curves, power output capabilities and the like, which may be stored in the memory of the AES 102 and used by the spectral management system 130. Such predetermined settings may also be input by designers of the AES 102 at the time the AES 102 is designed, such that the settings are not changeable by a user (listener) of the AES 102. Alternatively, or in addition, selected of the predetermined settings may be changeable/configurable by a user (listener) of the AES 102, such as a consumer who operates the AES 102 to provide audible sound in a listening space such as a room or a vehicle.

The spectral management system 130 may also operate based on operational changeable parameters such as AES 102 controls, user controls or external signals provided to the AES 102. AES 103 controls may include protective indications such as overvoltage, over current, high temperature, clip detection, an indication of the source of the audio content, or any other parameter generated within the AES 102 that is indicative of operation. User controls may include any user entered adjustments to operation of the AES 102, such as volume control of the AES 102, zone control (such as fade and balance control), equalization controls, or any other user entered parameter effecting operation and performance of the AES 102. External signals provided to the AES 102 may include ambient temperature, listening space related parameters such as background noise and audio content related indications. Listening space related parameters may include input of an indication of any parameter affecting the operational performance of the AES 102. For example, when the listening space is a passenger cabin of a vehicle, listening space related parameters may include indications such as windows up or down, engine speed, vibration, convertible top up/down, or any other parameters effecting operational performance of the AES 102. Audio content indications may include metadata included with the audio content, such as a genre (jazz, rock, talk and the like), or any other information related to the type of audio content, such as music or voice, live performance, and the like.

The AES 102 is only an example implementation provided to show the types of components that may be included in an AES with a spectral management system 130. In other implementations, the different devices may be located in a vehicle or a home entertainment system as one or more individual devices that are connected externally to make an audio/video system. Further, the connection of the different devices of the AES 102 is shown as solid lines in FIG. 1. These lines may be control lines, audio channels, electrical buses, or a combination of control lines, audio channels, and electrical buses that may carry data, control signals, and/or audio signals.

A power control module 146 may be coupled to the power supply or battery 128, RTC 118 and DSP 108, The RTC 188 may have settable timers in some implementations. Such an implementation is shown in FIG. 1 with the RTC 118 having multiple couplings with the power control module 146. A power line or bus may be present to power the RTC 118 and a communication bus or activation line may be present to enable the RTC 118 to signal the power control module 146 to energize at least a portion of the AES 102.

Figure 2:
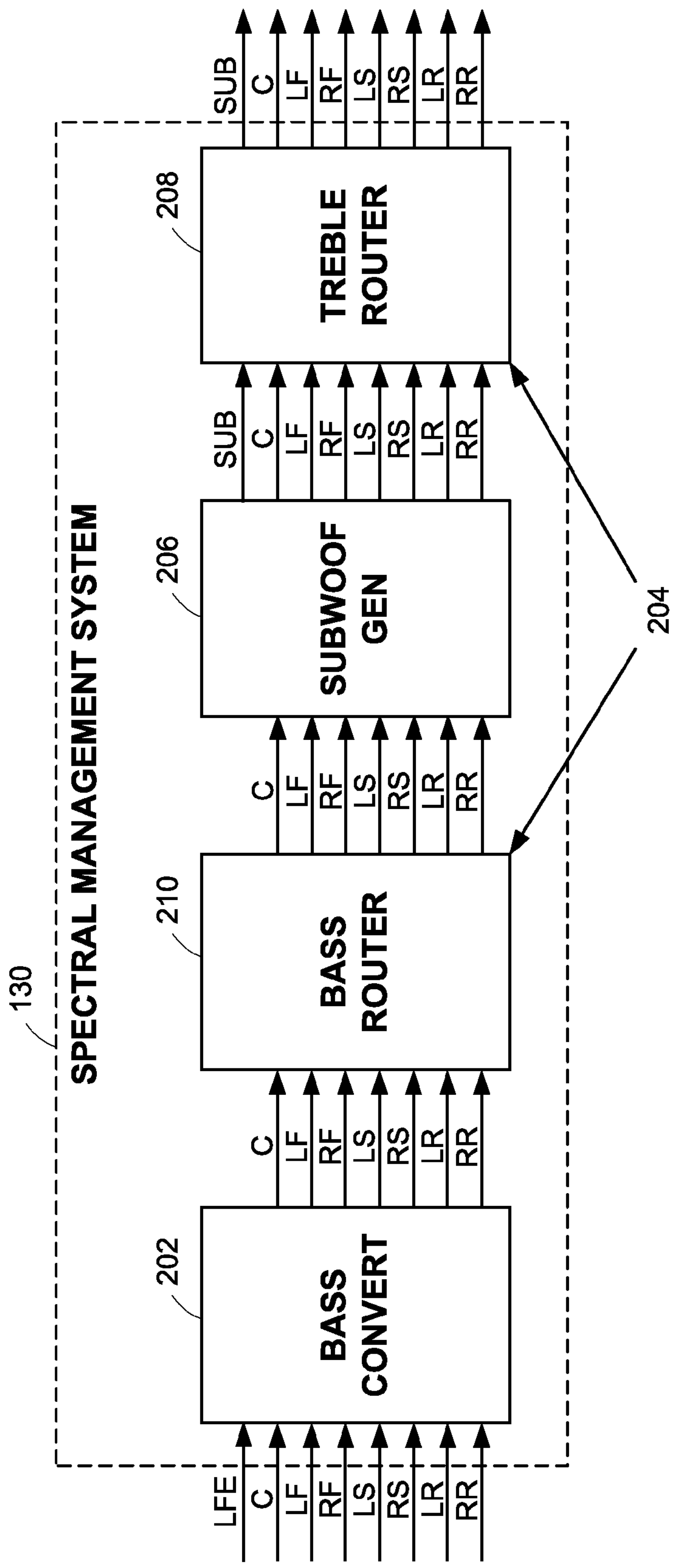
FIG. 2 is an example block diagram of the spectral management system of FIG. 1.

Turning to FIG. 2, a block diagram 200 of an example of the spectral management system 130 of FIG. 1 is depicted. The spectral management system 130 includes a mono bass converter 202, a distributed channel audio content router 204, and a subwoofer router 206. The distributed channel audio content router 204 may include one or both of a treble router 208 and a bass router 210. The spectral management system 130 may receive an input audio signal from an audio/video source consisting of a determined number of audio channels, such as stereo channels (right (R), left (L)), surround having five distributed audio channels (R, L, center (C), right rear (RR), left rear (LR)), 5.1 surround having five or more distributed audio channels (R, L, C, RR, LR) and a low frequency effect (LFE) channel; 6.1 surround having six distributed audio channels (R, L, C, RR, LR, center (CR)) and an LFE channel; Logic 7™ having seven distributed audio channels (R, L, C, right side (RS), left side (LS), RR, LR) and an LFE channel; or any other number of channels forming an audio signal to be routed to loudspeakers. As used herein, the terms "distributed audio channel," or "distributed audio channels" refers to all audio channels other than an LFE channel or a sub channel.

The channels provided in the input audio signal may be designated by the audio content, or may be generated by the AES 102 by up-mixing or down-mixing a fewer or greater number of channels received in an audio signal from an audio/video source. Audio content included in each of the audio channels received in an audio signal are pre-designated for routing to a particular loudspeaker based on the channel in which the audio content is contained, For example, a center audio channel is designated for routing to loudspeakers configured as one or more center loudspeakers in the AES 102, and a right rear audio channel is designated for routing to one or more loudspeakers designated as right rear loudspeakers in the AES 102.

The spectral management system 130, however, may separate out frequency ranges of audio content included in the different audio channels, re-route these separated frequency ranges to the same or different audio channels included in the audio content taking into account the hardware, such as loudspeaker frequency response, system configuration, such as loudspeaker location, and any other stored/received information or parameters, as previously discussed. The audio channels containing the re-routed frequency ranges may be formed into an output audio signal have audio channels with rearranged audio content.

Using the spectral management system 130 to perform this audio content frequency range separation and re-combination, the spectral management system 130 may avoid loss of any spectral energy content included in the audio signal. In other words, the spectral management system 130 performs separation, re-routing, and combination of separated ranges of frequency of audio content without loss any part of the input audio signal. Instead, the entire input audio signal received by the spectral management system 130 is supplied by the spectral management system 130 as an output audio signal having adapted audio channels to drive loudspeakers. The audio channels included in the output audio signal are referred to as "adapted" audio channels due to the audio content being rearranged for the AES 102 in which the spectral management system 130 is operating. The audio channels may be adapted to the parameters of the AES 102, in order to optimize fidelity, minimize distortion, minimize power consumption of the AES 102, and/or any other system condition affected by the arrangement of the frequency ranges of the audio content on the audio channels.

In addition, the number of distributed channels provided in the audio input signal are the same amount as is provided as adapted distributed audio channels by the spectral management system 130 in the audio output signal. Thus, during operation, the spectral management system 130 may route the different separated frequency ranges within the audio channels contained in an audio signal such that desired frequency ranges are associated with desired audio channels and subsequently provided to appropriate loudspeakers 132-146 associated with the AES 102 without any loss of audio content contained in the input audio signal.

The audio channels in an audio signal may be received at the spectral management system 130 and selectively processed with the bass converter 202 included in the spectral management system 130. A low frequency range of at least some of the distributed audio channels may be separated from the remaining frequency range of the audio content present on the respective distributed audio channels by the bass converter 202. The separated low frequency range of distributed audio channels may be summed to form routed bass audio content by the bass converter 202. In addition, when an LFE audio channel is received by the spectral management system 130, the audio content on the LFE channel may be included with the sum of the separated low frequency range of audio channels that form the routed bass audio content.

The formation of the routed bass audio content by the bass converter 202 may be made by low-pass filtering and high-pass filtering a least some of the distributed audio channels. Low pass filtering results in a predetermined low frequency range of audio content from each of the distributed audio channels, and high pass filtering results in a predetermined higher frequency range of audio content from each of the distributed audio channels. The combination of the low-pass filtered audio content and the high-pass filtered audio content for a particular audio channel may represent the entirety of the audio content for the particular audio channel, Division of each of the distributed audio channels into a low frequency range portion (or part) and a higher frequency range portion (or part) may be based on a predetermined tunable bass center frequency. In one example, the predetermined tunable bass center frequency may be about 80 Hz resulting in the frequency range of the low-pass filtered audio content being about 0 Hz to 80 Hz, and the high-pass filtered audio content being about 80 Hz to about 20 kHz. In other examples, any other predetermined tunable bass center frequency may be used, such as in a range of 50 Hz to 300 Hz.

The bandwidth of the low-pass filtered audio content may be combined to form a routed bass audio signal formed at the low end of the human auditory range. In other implementations, less than all of the distributed audio channels may be low pass filtered and combined by the bass converter 202 to create the routed bass audio signal, while the remaining distributed audio channels may still contain undivided audio content within both the predetermined low frequency range and the predetermined high frequency range.

Following creation of the routed bass audio signal, the bass converter 202 may sum the routed bass audio signal with the high-pass filtered audio content (the un-routed audio content) of each of at least a portion of the distributed audio channels. Thus, at least some of the distributed audio channels, such as left front, right front, center, left side, right side, left rear, and right rear audio channels processed by the bass converter 202 may include an un-routed frequency spectrum component that is a spatial component above the predetermined tunable bass center frequency, and a bass component below the predetermined tunable bass center frequency. In some cases, one or more of the distributed audio channels may be passed through the bass converter 202 without separation of any range of frequency of the audio content on a respective channel, resulting in the audio content on a distributed audio channel provided by the bass converter 202 containing no separated or added frequency range of audio content.

The audio channels, at least some of which contain both a higher frequency range of un-routed audio content and a bass frequency range of routed audio content may then be selectively processed with the distributed channel audio content router 204 included in the spectral management system 130. Specifically, selective processing of the audio content may be performed with the bass router 210. At this point, the LFE channel has been eliminated (if it was present in the audio signal), so the bass router 210 receives only distributed audio channels. However, the distributed audio channels contain the entirety of the audio content contained in the input audio signal received by the spectral management system 130 absent loss or gain of audio content in the audio signal.

The bass router 210 may process each of the audio channels of the audio signal based on predetermined settings or operational changeable parameters of the AES 102, such as the operational characteristics of the respective loudspeakers in the AES 102 that are to be driven by the respective channels. In other words, the bass router 210 focuses on routing the low frequency portion of the audio content on each of the audio channels by taking into account operational characteristics such as low frequency output capability of the respective loudspeakers, the low frequency distortion characteristics of the respective loudspeakers, the position of the respective loudspeakers, or any other operationally related parameters, stored parameters, and/or input parameters, as previously discussed.

Each of the adapted audio channels may include both un-routed spatial audio content above the predetermined bass center frequency, and routed bass audio content below the predetermined bass center frequency of the bass converter 202 as previously described. Accordingly, the frequency range being separated out of the audio content of a particular audio channel by the bass router 210, may include both un-routed spatial audio content and routed bass audio content, or only routed bass audio content. Some of the audio channels may not be processed by the bass converter 202 and thus may still include both un-routed spatial audio content and the entirety of the routed bass audio content. Separation into a low frequency range of the audio content and a higher frequency range of the audio content may be performed using second order high pass and low pass filters and a predetermined tunable mid-bass center frequency. The mid-bass center frequency may be in the range of about 40 Hz to about 400 Hz, for example. Using the predetermined tunable mid-bass center frequency, different parts of the frequency range of the audio content on a particular audio channel may be separated and routed as mid-bass audio content.

The mid-bass audio content (the rerouted parts of the frequency range of the audio content on the respective audio channels) may also be maintained in (or returned to) phase alignment with the rest of the audio content to allow selective combination or recombination of frequency ranges of audio content among the distributed audio channels. As an example, the low frequency portion of the audio content present on the center channel may be separated out as mid-bass audio content and routed to the left front and right front channels due to limitations in the frequency response of a center channel transducer to handle such low frequency audio content. To perform such separation and routing, the low frequency portion of the audio content present on the center channel (the mid-bass content) may be passed through a phase shifting filter and added to the audio content in the left front channel and the right front channel such that the relative phase of the left front, center and right front channels is maintained. In other examples, phase alignment may be omitted.

After the audio content on the audio channels has been separated out as mid-bass content, routed and recombined by the bass router 210 to form adapted audio channels having rearranged audio content, the processed audio signal may be passed to the subwoofer router 206. At this point, the LFE channel eliminated by the bass converter 202 (if present in the input audio signal) remains eliminated, yet the remaining adapted distributed audio channels still contains the entirety of the audio content included in the audio signal received by the spectral management system 130. In addition, the audio content has been processed to include both the high frequency un-routed spatial part, and the low frequency routed bass audio part created by the bass converter 202, and the mid-bass audio content (the low frequency parts of the frequency range of the audio content) may have been re-arranged among the distributed audio channels by the bass router 210.

The subwoofer router 206 operates to generate a sub channel from the audio content included in the distributed audio channels received from the bass router 210. The sub channel is newly created by the subwoofer router 206 and selectively populated with low frequency audio content referred to as sub audio content. Operation of the subwoofer router 206 to process the distributed audio channels may be based on predetermined settings or operational changeable parameters of the AES 102, such as stored parameters, received parameters or any other parameters, as previously discussed.

During operation, the subwoofer router 206 may generate the subwoofer channel by selectively separating a low frequency portion of audio content on one or more of the distributed audio channels destined to drive loudspeakers with limited low frequency capability and routing the sub audio content (low frequency portion of the audio content) to the subwoofer channel. Separation of the audio content into the low frequency portion and the high frequency portion may be based on filtering the audio signal on a selected audio channel with a second order low pass filter and a high pass filter. The frequency range of the low frequency portion and the frequency range of the high frequency portion may be selected using a predetermined tunable subwoofer center frequency. The subwoofer center frequency may be in the range of about 40 Hz to about 200 Hz, for example. Using the predetermined tunable subwoofer center frequency, different parts of the frequency range of the audio content on a particular audio channel may be separated out as the sub audio content and routed.

The predetermined tunable subwoofer center frequency may be at a lower frequency than the predetermined tunable mid-bass center frequency. Accordingly, some or all of the frequency range of the mid-bass audio content that was rerouted by the bass router 210 to other audio channels may again be selectively separated out of audio channels and rerouted based on the predetermined tunable subwoofer center frequency. In addition, each of the distributed audio channels may include both un-routed spatial audio content above the predetermined bass center frequency, and routed bass audio content below the predetermined bass center frequency of the bass converter 202. Accordingly, the frequency range being separated out of the audio content of an audio channel by the subwoofer router 206, may include both un-routed spatial audio content and routed bass audio content, or only routed bass audio content depending on the predetermined tunable subwoofer center frequency and the predetermined tunable bass center frequency.

For example, during operation, the subwoofer router 206 may receive the audio signal from the bass router 210 and may route the audio content on the left front channel through high pass and low pass filters such that a low frequency portion of the audio content on the left front channel (the subwoofer audio content) is routed to the subwoofer channel. Similarly, the audio content on the left side audio channel may be routed through high pass filters and low pass filters such that the subwoofer content on the left side audio channel may be routed to the subwoofer channel. The subwoofer audio content frequency ranges selectively separated from the audio channels may be routed by the subwoofer router 206 and combined to form the sub channel. The sub channel, along with the remaining audio channels, such as R, L, C, RS, LS, RR, LR channels, may then be selectively processed with the distributed channel audio content router 204, and more specifically with the treble router 208.

The treble router 208 receives the audio signal and performs separation, routing and recombination of a predetermined high frequency range of the audio content referred to as treble audio content that is present on at least some of the distributed audio channels. The treble router 208 may process distributed audio channels of the audio signal based on the operational characteristics of the respective loudspeakers in the AES 102 that are to be driven by the respective channels. In other words, the treble router 208 focuses on routing the treble audio content (the high frequency portion of the audio content on one or more of the audio channels) by taking into account operational characteristics such as frequency response of the respective loudspeakers at higher frequencies, position of the loudspeakers, directivity of the loudspeakers, distortion characteristics of the loudspeakers, high frequency resonance's in the loudspeakers or any other operationally related parameters, stored parameters, and/or input parameters, as previously discussed.

Routing of the treble audio content (high frequency portion of the audio content) on a particular audio channel is performed by first subjecting the audio content on the particular audio channel to high and low frequency filters that divide the audio content into a low frequency portion and a high frequency portion based on a predetermined tunable treble center frequency. In one example, the predetermined tunable treble center frequency may be set at about 8 kHz. In other examples, other frequencies may be selected.

The predetermined tunable treble center frequency may be at a higher frequency than the predetermined tunable bass center frequency, the predetermined tunable bass center frequency and the predetermined tunable subwoofer center frequency. Accordingly, the relatively lower frequency range of the mid-bass audio content rerouted by the bass router 210 to other audio channels may not be selectively separated out of audio channels and rerouted based on the predetermined tunable treble center frequency. The subwoofer audio content, if not yet separated out and routed to the sub channel will also not be part of the treble audio content that is separated and routed due to the relatively high frequency of the predetermined tunable treble center frequency. In addition, each of the distributed audio channels may include both un-routed spatial audio content above the predetermined bass center frequency, and routed bass audio content below the predetermined bass center frequency of the bass converter 202. The treble audio content frequency range being separated out of the audio content of an audio channel by the treble router 206, may include un-routed spatial audio content, or a combination of un-routed spatial audio content and routed bass audio content, but may not include only routed bass audio content, depending on the predetermined tunable treble center frequency and the predetermined tunable bass center frequency.

The treble audio content on the audio channels that has been separated, routed and recombined with the high and/or low frequency ranges of audio content on other audio channels may be at an upper end of the human auditory range, such as in a range of about 4 kHz to about 20 kHz. Due to the relatively high frequency of the separated frequency ranges, combination of audio content on an audio channel with the separated frequency range may be completed absent phase alignment. No phase alignment is necessary because human hearing cannot typically detect any distortion created in the audio content by combination of such relatively small differences in phase in the upper end of the human auditory range. Thus, when the audio content present on an audio channel, and a separated frequency range of treble audio content are combined, phase alignment of the separated treble audio content frequency range and the audio content present on the audio channel is not necessary. Alternatively, the separated frequency range of the treble audio content may be phase aligned with the audio content present on the audio channel prior to being combined.

Following processing by the bass converter 202 and one or more of the bass router 210, the treble router 208, and the subwoofer router 206 an output audio signal containing the audio channels, which includes the distributed audio channels such as R, L, C, RS, LS, RR, LR, and the sub channel are provided by the spectral management system 130 to drive loudspeakers in the AES 102 on the respective audio channels. The audio content present in the output audio signal, and more specifically on the distributed audio channels and the sub channel contains the same spectral energy as was provided in the audio input signal, which contained the same distributed audio channels and an LFE channel (if present). However, the frequency ranges of the audio content contained in the various respective distributed audio channels may be different due to the rerouting and recombining performed by the spectral management system 130. For example, a first range of frequency content provided in the input audio signal content on the center channel may be present on the left and right front channels in audio output signal. In another example, bass audio content present in the center channel, right channel, and left channel in the input audio signal may now be present on the sub channel in the output audio signal.

The adapted distributed audio channels, and the generated sub channel may be tailored for the particular AES 102 in which the spectral management system 130 is operating. In other words, different frequency ranges of the audio content received in the input audio signal may be rearranged among the distributed audio channels and the sub channel to conform to operational characteristics of the hardware, the operating environment, or any other performance related parameters of the AES 102.

Figure 3:
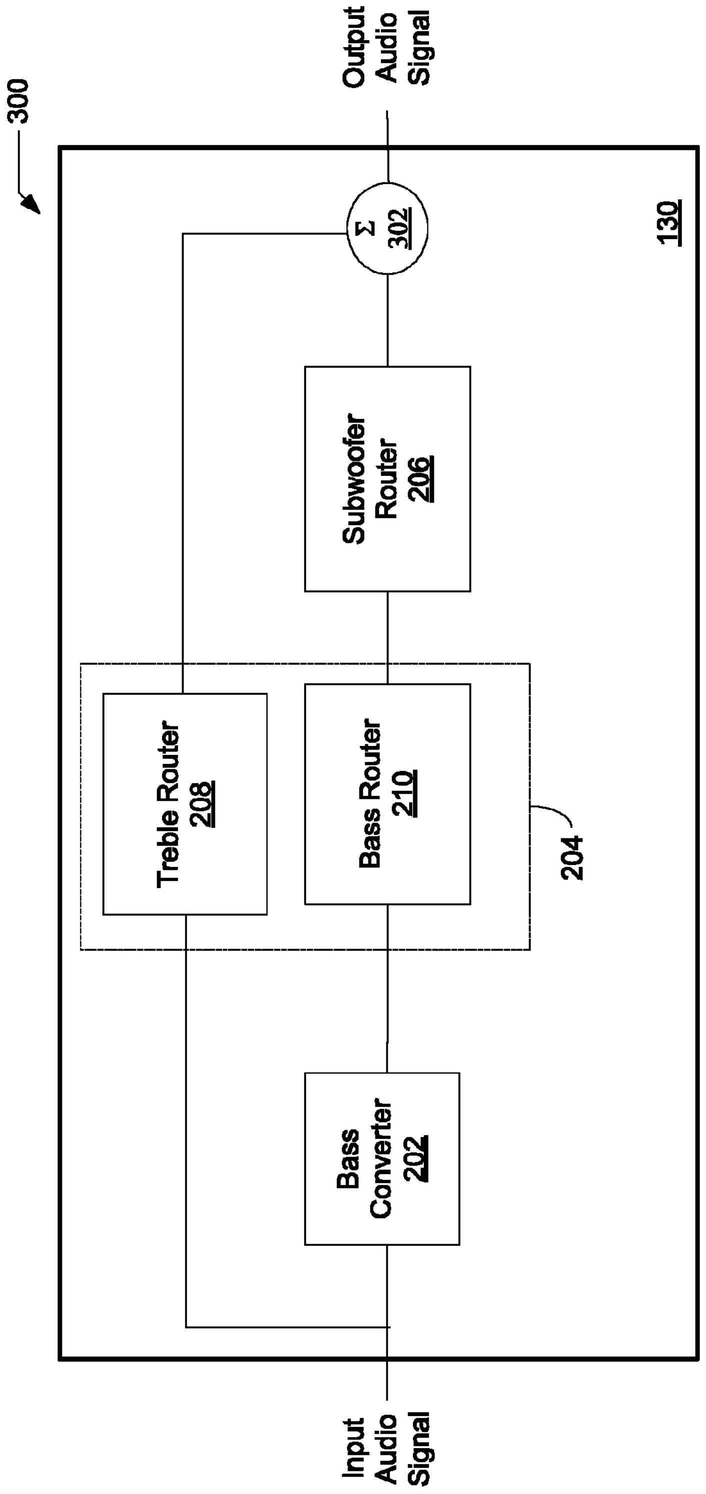
FIG. 3 is an alternate example block diagram of the spectral management system of FIG. 1.

FIG. 3 is an alternate example diagram 300 of the spectral management system 130 of FIG. 1. In FIG. 3, the input audio signal is received at both the bass converter 202 and the treble router 208. The audio content included on the audio channels processed by the bass converter 202 to include the routed bass audio content may next be processed by the bass router 210 and the subwoofer router 206. A first set of distributed audio channels included in the processed audio signal from the subwoofer router 206, such as left front, right front, center, left side, right side, left rear, and right rear channels, may be combined with a second set of respective distributed audio signals processed by the treble router 208. The first set of distributed audio signals and the second set of distributed audio signals may be combined by one or more signal combiners 302.

In this example, to avoid any loss or addition of audio content between the input audio signal and the output audio signal by the spectral management system 130, a gain stage may be used to divide the spectral energy of the audio content in the input audio signal in half such that the bass converter 202 and the treble router 208 are provided equal amounts of the spectral energy included in the high frequency or upper end of the input audio signal. Since the treble audio content in the audio channels processed by the treble router 208 is at the upper end of the human auditory range, phase alignment of the audio content included in the first set of audio channels and the second set of audio channels is not necessary. Alternatively, the audio content in first set of audio channels and in the second set of audio channels may be phase aligned prior to being combined with the signal combiners 302. The adapted distributed audio channels and the generated sub channel containing the re-arranged audio content may be provided as an output audio signal by the spectral management system 130 to drive loudspeakers on respective audio channels.

Figure 4:
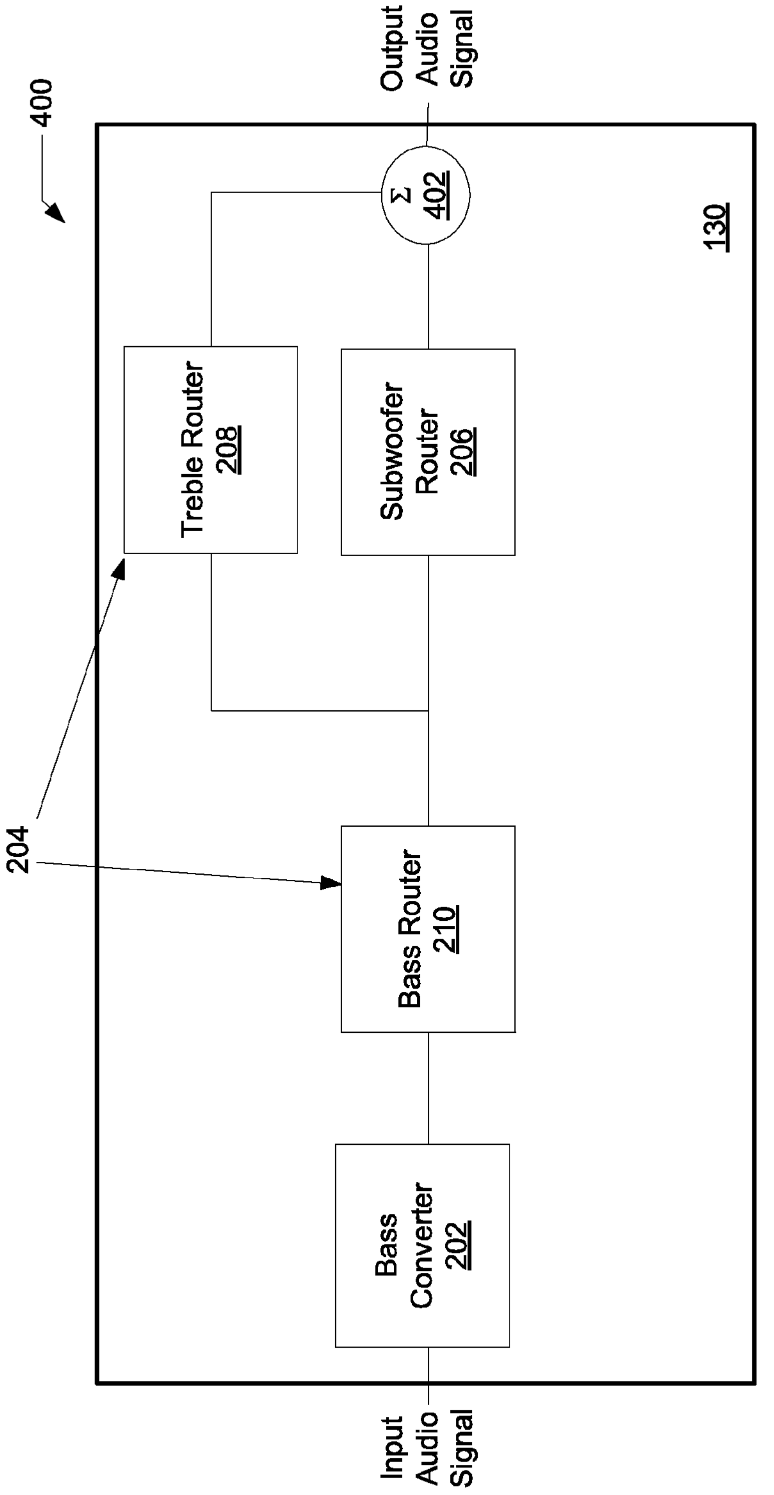
FIG. 4 is another alternate example diagram of the spectral management system of FIG. 1.

FIG. 4 is another example diagram 400 of the spectral management system 130 of FIG. 1. In FIG. 4, the spectral management system 130 may receive the input audio signal having audio channels which may include distributed audio channels such as RF, LF, C, RS, LS, RR, LR and an LFE channel. The input audio signal may be processed by the bass converter 202 to create the un-routed spatial range and the routed audio bass content on the distributed audio channels, and eliminate the LFE channel (if present). The bass router 210 then receives and processes the distributed audio channels included in the audio signal. The resulting audio signal containing the distributed audio channels is then passed to both the subwoofer router 206 and the treble router 208 for parallel processing.

The resulting audio signal provided from the subwoofer router 206 includes not only the distributed audio channels, such as RF, LF, C, RS, LS, RR, LR, but also the sub channel generated by the subwoofer router 206. The resulting audio signal provided from the treble router 208 includes only the distributed audio channels that have been processed for the upper end of the frequency range by the treble router 208. The distributed channels processed by the subwoofer router 206 and the distributed channels processed by the treble router 208 are combined by one or more signal combiners 402. The distributed channels may be combined without noticeable artifacts being created in the audio content even if the distributed channels provided to the combiner 402 by the treble router 208 are not completely in phase with the distributed audio signals provided by the subwoofer router 206 to the combiner 402 since the out of phase portion of the audio content (if any) is at the upper end of the frequency spectrum of the audio signal. Alternatively, the distributed channels provided from the treble router 208 and/or the subwoofer router 206 may be phase adjusted in order to be combined in phase. The output audio signal provided from the combiner 402, which includes the adapted distributed audio signals such as RF, LF, C, RS, LS, RR, LR, and the generated sub channel may then be distributed to the different respective loudspeakers.

Figure 5:
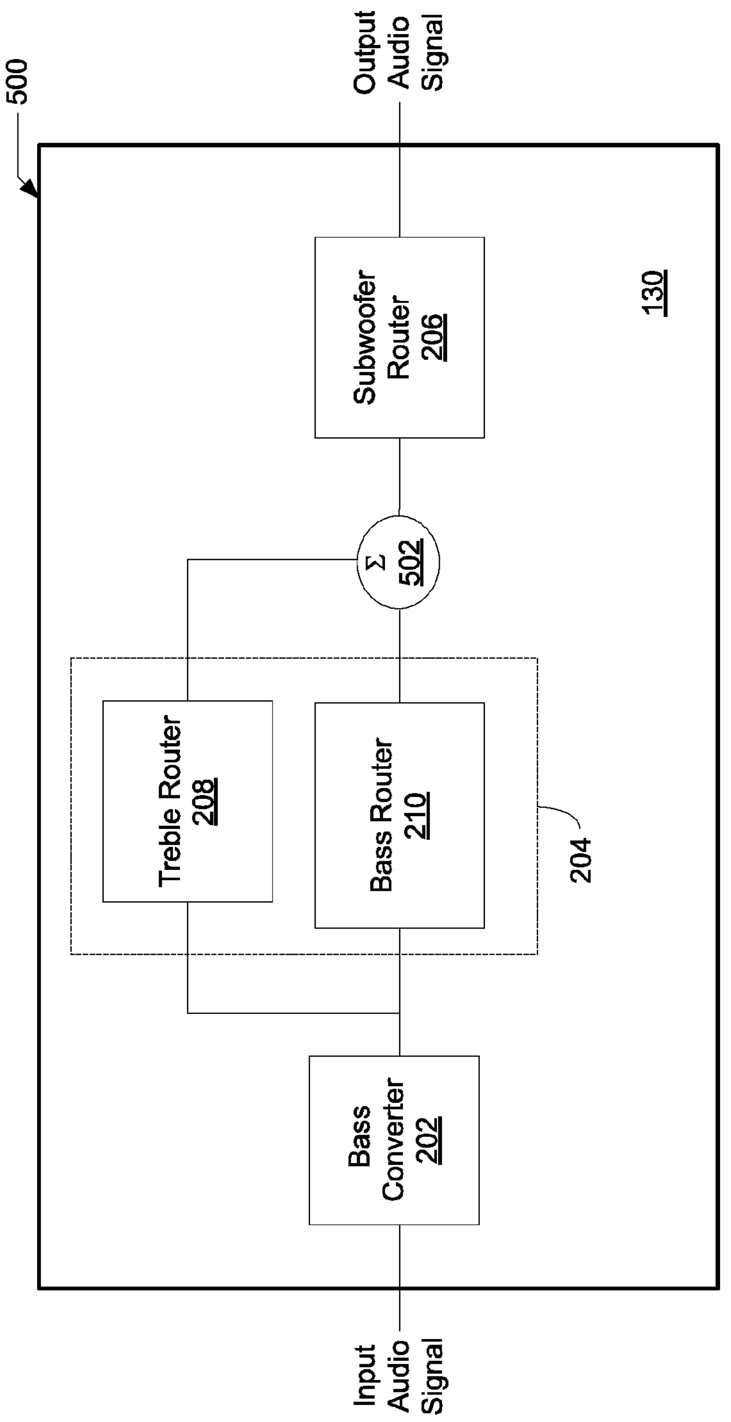
FIG. 5 is yet another alternate example diagram of the spectral management system of FIG. 1.

FIG. 5 is yet another example diagram 500 of the spectral management system 130 of FIG. 1. In FIG. 5, the spectral management system 130 receives the audio signal having distributed audio channels such as RF, LF, C, RS, LS, RR, LR as well as the LFE (if present), which are processed by the bass converter 202. Both the bass router 210 and the treble router 208 then receive and process the distributed audio channels included in the audio signal in parallel. The resulting adapted distributed audio channels, such as RF, LF, C, RS, LS, RR, LR, are then combined by one or more signal combiners 502.

The adapted distributed audio channels may be combined without noticeable artifacts being created in the audio content even if the distributed channels provided to the combiner 502 by the treble router 208 are not completely in phase with the distributed audio signals provided by the bass router 210 since the out of phase portion of the audio content (if any) is at the upper end of the frequency spectrum of the audio signal. Alternatively, the audio content on the adapted distributed channels provided from the treble router 208 and/or the bass router 210 may be selectively phase adjusted in order to be combined in phase. The resulting audio signals are then processed by the subwoofer router 206 to route a low frequency range of at least some of the distributed audio channels and generate the sub channel with low frequency audio content thereon. The audio channels, including the adapted distributed audio channels and the sub channel may then be distributed to the different loudspeakers as the audio output signal.

Figure 6:
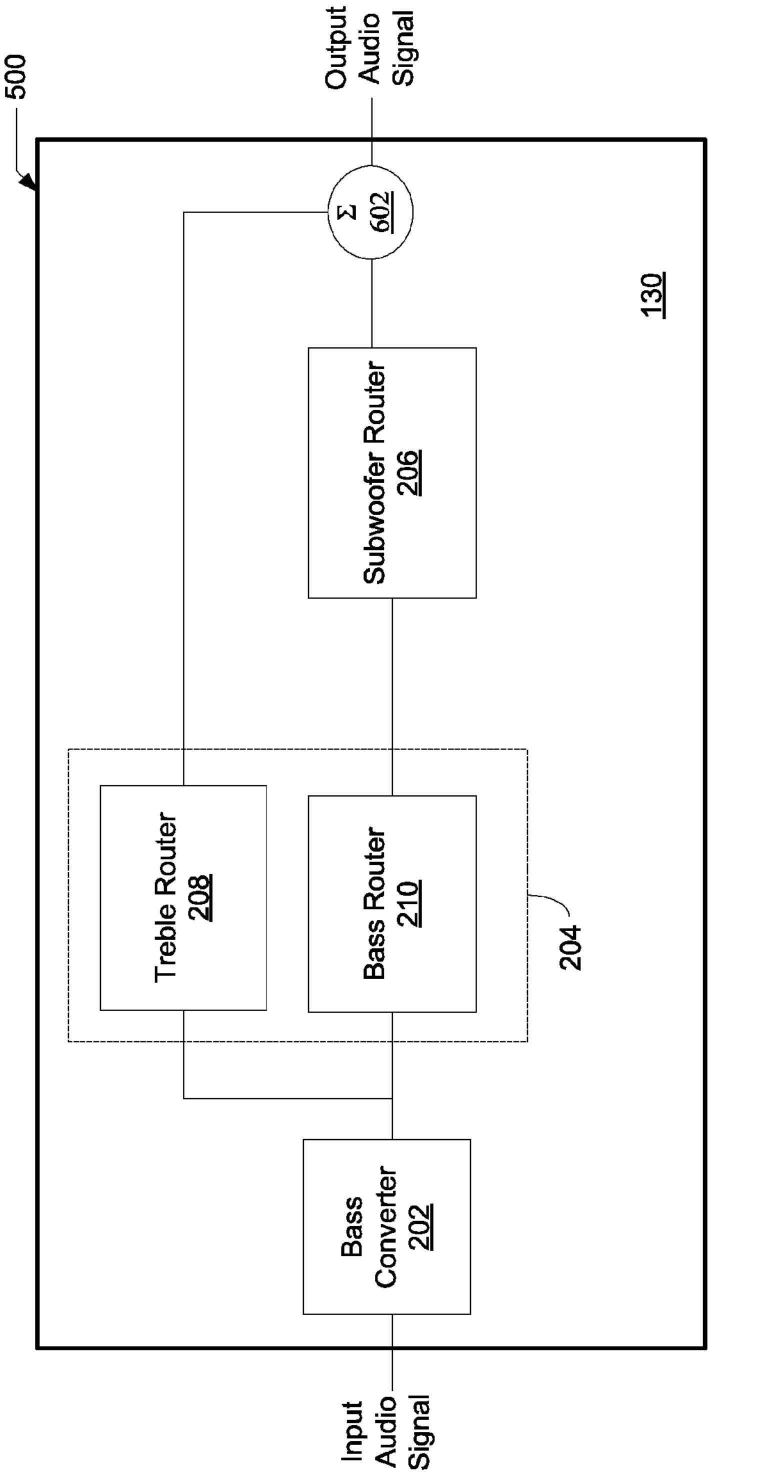
FIG. 6 is yet another alternate example diagram of the spectral management system of FIG. 1.

FIG. 6 is yet another alternate example diagram 600 of the spectral management system 130 of FIG. 1. In FIG. 6, the spectral management system 130 receives the input audio signal and processes the audio channels with the bass converter 202. Both the bass router 210 and the treble router 208 may then receive and further process the distributed audio channels. The distributed audio channels subject to low frequency processing by the bass router 210 may then be passed to the subwoofer router 206 where the sub channel is generated and added to the audio channels. The distributed audio channels, excluding the sub channel, provided from the subwoofer router 206 may then be combined by one or more signal combiners 602 with the distributed audio channels subject to high frequency processing by the treble router 208. The resulting output audio signal that includes the combined adapted distributed audio channels and the sub channel may then be distributed to the different respective loudspeakers.

As shown by example in FIGS. 2-6, many possible arrangements of the bass converter 202, bass router 210, subwoofer router 206 and treble router 208 exist. The examples provided are not all the possible configurations within the spectral management system 130, but rather provide only some examples of how the bass converters, the distributed channel audio content routers and the subwoofer router may be configured within the spectral management system 130.

Figure 7:
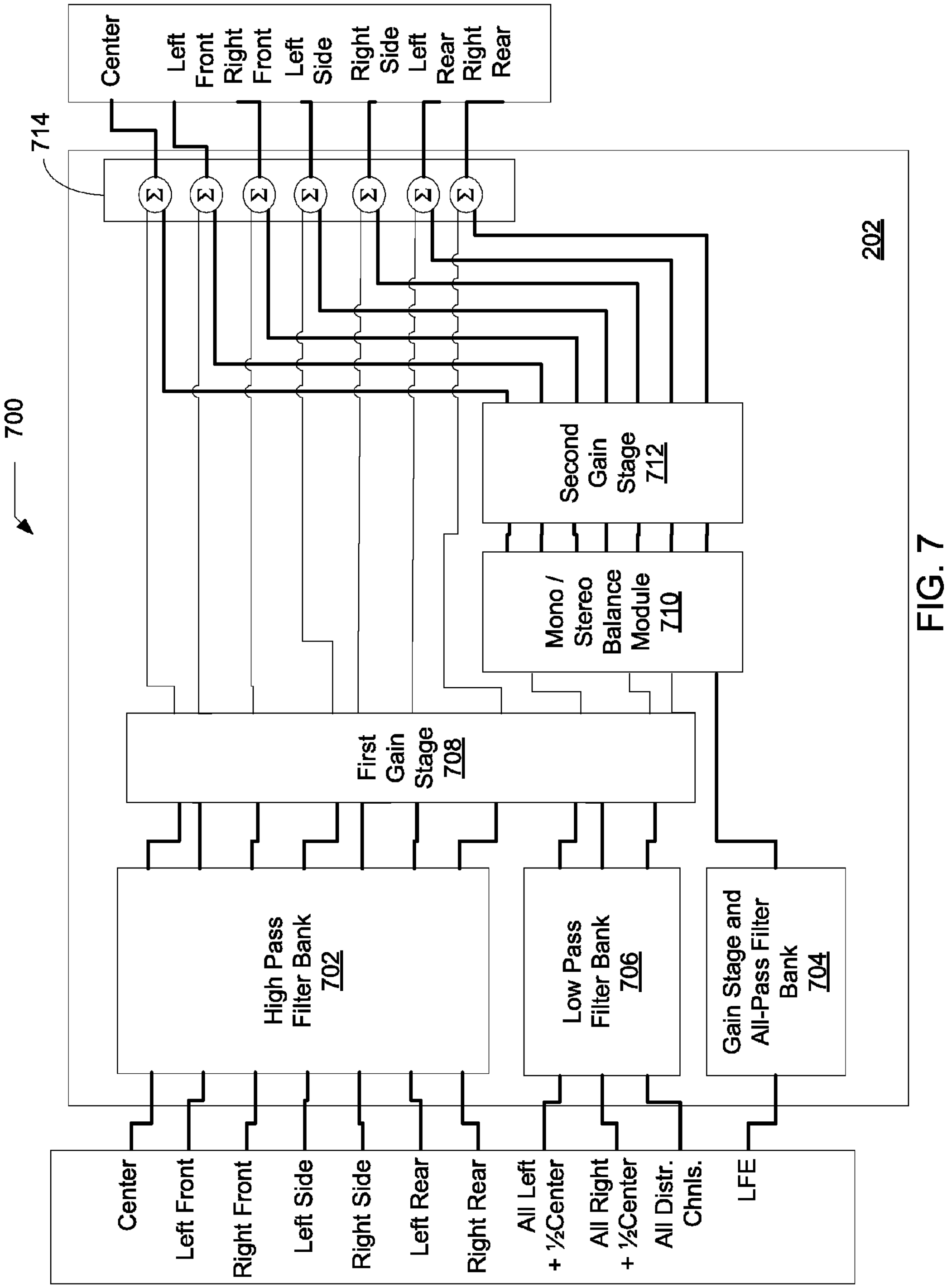
FIG. 7 is an example block diagram of the bass converter of FIG. 2.

FIG. 7 is a block diagram of an example of the bass converter 202 of FIG. 2. The audio signal received by the bass converter 202 may include distributed audio channels such as center, left front, right front, left side, right side, left rear, and right rear distributed audio channels that are passed to a filter bank 702 formed as a high pass filter bank. The high pass filter bank 702 removes a low frequency portion of the audio content on each of the distributed channels resulting in the high frequency spatial content remaining on at least some of the respective audio channels that is not routed to other audio channels by the bass converter 102. A low frequency effects (LFE) channel, if provided as one of the audio channels, may be passed to a gain stage and filter bank 704 containing all pass filters. The gain stage and filter bank 704 may scale the gain of the LFE channel, maintain the LFE channel in phase alignment with the distributed channels, and divide the audio content in the LFE channel in half for separate routing of each half.

In addition, the left distributed audio channels, such as left front, left rear, and left side audio channels and half of the audio content on the center audio channel may also be passed to a filter bank 706 formed as a low pass filter bank. Similarly, the right audio channels, such as right front, right rear, and right side, and the other half of the audio content on the center audio channel may be combined and also passed to the low pass filter bank 706. The low pass filter bank 706 may remove a high frequency portion of the audio content on each of the distributed channels resulting in part of the bass audio content. The filter banks 702, 704 and 706 may separate the audio channels into different frequency bands or ranges that are phase aligned. All signals that pass through these filter banks may receive the same phase modification. As used herein, the term "filter bank" may include software, hardware, and/or some combination of hardware and software. The software may be in the form of instructions stored in a memory device. The hardware may include circuitry, electronic components, circuit boards, and the like.

The output of the high pass filter bank 702 and the low pass filter bank 706 may be passed to a first gain stage module 708. The first gain stage module 708 allows selective attenuation of the frequency ranges of the audio content on the audio channels by attenuating the audio channels in a synchronized fashion to maintain the same total energy in the audio signal. Synchronized selective attenuation of the audio channels ensures that none of the audio content included in the original audio signal is lost by decreasing energy in one or more audio channels, while at the same time increasing energy in one or more other audio channels such that the overall effect on the energy of the audio signal remains zero.

For example, as a right front gain stage, center gain stage and left front gain stage in the first gain stage module 702 for the right front, center and left front audio channels may be attenuated by a certain amount, such as −10 dB, in synchronicity, a left side gain stage, a right side gain stage, a left rear gain stage and a right rear gain stage in the gain stage module 702 may correspondingly be increased by +10 dB to maintain the same energy in the overall audio content. This example may considered similar to a "fade" control operation in which audio content is moved from front loudspeakers to rear loudspeakers. Accordingly, substantially equal and opposite attenuation may be performed with the first gain stage module 702 to avoid any loss of audio content from the audio signal. Configuration of which gain stages in the first gain stage module 702 are reactive to changes in other gain stages may be one-to-one, one-to-many, or many-to-many. In other examples, the gain stage module 702 may be omitted.

The output of the gain and all-pass filter bank 704 (if an LFE channel is present) and the output from the low pass filter bank 706 and gain stage module 702 are received at a mono/stereo balance module 710. The mono/stereo balance module 710 may combine or blends half of the LFE signal and the low frequency range of the right audio channels to form a right blended bass audio signal, and combine or blend the other half of the LFE signal with the low frequency portion of the left audio channels to form a left blended bass audio signal. All of the distributed audio channels and the LFE channels may be maintained in relative phase alignment to allow generation of the blended right bass audio signal and the blended left bass audio signal. Alternatively, the audio channels may be phase aligned prior to blending. The term "module" may include software, hardware, and/or some combination of hardware and software. The software may be in the form of instructions stored in a memory device and executed by a processor. The hardware may include circuitry, electronic components, gates, circuit boards, and the like.

The blended right bass audio signal and the blended left bass audio signal output by the mono/stereo balance module 710 may be further processed by a second gain stage module 712. The second gain stage module 712 may apply proportional gain for audio channel-to-audio channel balance of the low frequency portion of at least some of the distributed audio channels while maintaining total gain at unity for the combination of all of the distributed audio channels, Application of the proportional gain to the low frequency portion of the distributed audio channels may provide a purely mono routed bass audio signal by making 50% of the blended left and right bass audio signals go to the left side distributed audio channels, and 50% of the blended left and right bass audio signal go to the right side distributed audio channels. Alternatively, a purely stereo routed bass audio signal may be formed to maximize spatiality by providing 100% of the blended left bass audio signal to the left side distributed audio channels, and 100% of the blended right bass audio signal to the right side distributed audio channels.

Adjustment of the percentage of the routed bass audio signal may be performed by attenuating and amplifying the left and right blended bass audio signals supplied to each one of the distributed audio channels. In this way, each of the audio channels will receive a ratio of the left and right blended bass audio signals depending on the gain applied. Accordingly, in the cases of a mono routed bass audio signal, on any given channel, the blended left and right bass audio signals may be equally attenuated by the same amount of gain. In the case of a stereo routed bass audio signal, depending on the particular channel, one of the blended left and right bass audio signals may be attenuated to 0% by negative infinite gain, while the other may be amplified to 100% by 0 dB of gain.

In another alternative, some percentage of a mono signal may be selected, such as 30% mono, in which 30% of the right side bass audio signal goes to the left side distributed audio channels, and 70% of the left side bass audio signal goes to the left side distributed audio channels. Similarly, 70% of the right side bass audio signal goes to the right side distributed audio channels, and 30% of the left side bass audio signal goes to the right side distributed audio channels to maintain 100% on each side. All of the distributed audio channels may be attenuated equally, with a gain that may depend upon the number of output channels, such as with a gain of −16.9 dB for 7 output channels, or a gain of −13.98 dB for 5 output channels, to obtain a routed bass audio signal that may be mono, partly mono or purely stereo. Total gain may be maintained at unity so that energy contained in the audio content remains unchanged—none lost, and none added.

The output from the second gain stage module 712 forms the routed bass audio content, which may be combined or summed with the un-routed spatial content output from the high pass filter bank 702 using a summer module 714. The high frequency range of the un-routed spatial audio content on a particular audio channel may be combined with one of the blended right bass audio signal or the blended left bass audio signal depending on the particular audio channel, In other words, those channels that are right distributed audio channels (RF, RS, RR) may have a high frequency range of un-routed spatial audio content combined with the blended right bass audio signal, and those channels that are left distributed audio channels (LF, LS, LR) may have a high frequency range of un-routed spatial audio content combined with the blended left bass audio signal. The resulting adapted distributed audio channels may be output to the bass converter 202.

Figure 8:
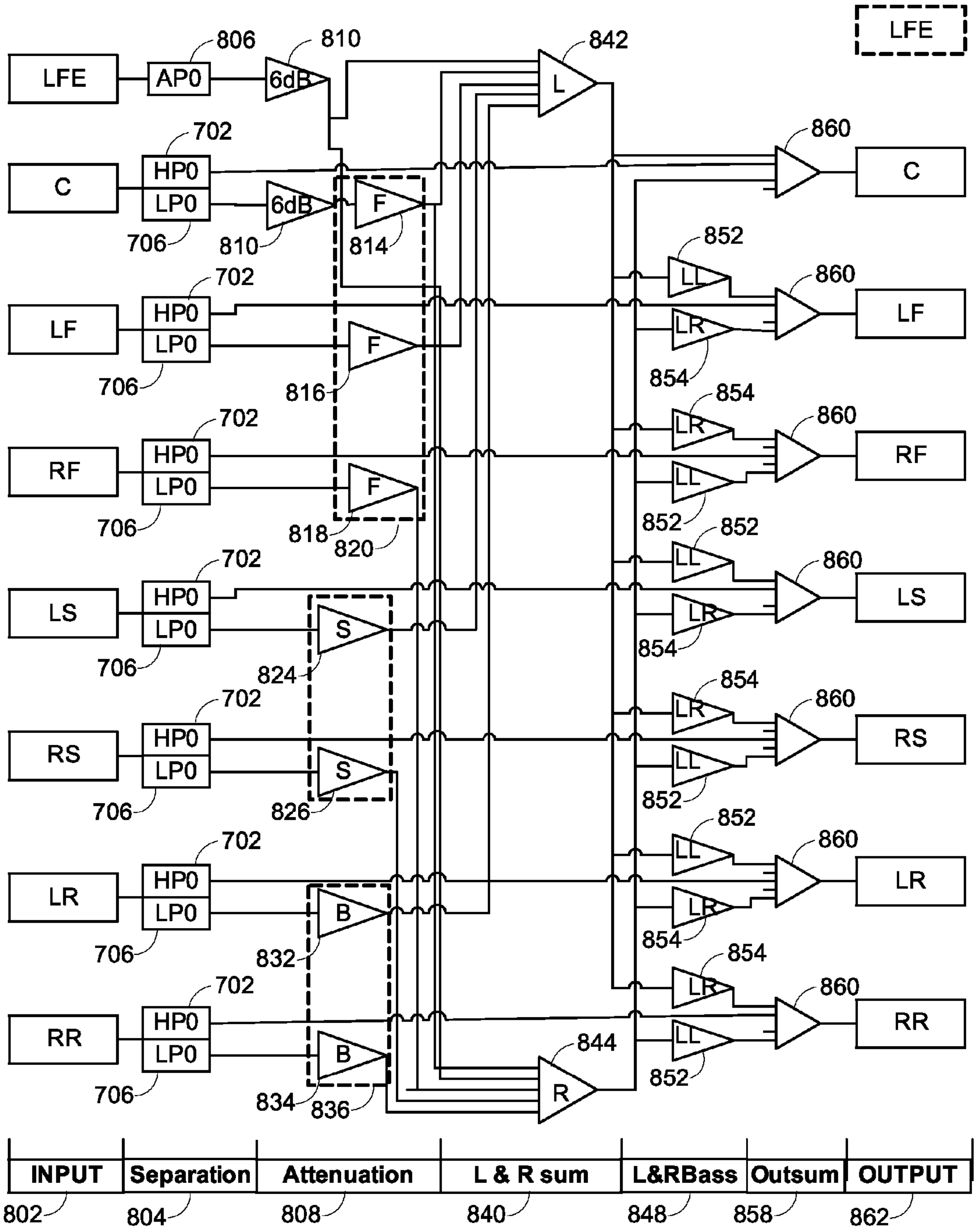
FIG. 8 depicts an example block diagram of the bass converter of FIG. 2 and FIG. 7.

FIG. 8 is an example more detailed block diagram of the bass converter 202 of FIG. 2 and FIG. 7. In FIG. 8, the audio channels received in the audio input signal are included in an inputs section 802 of the bass converter 202. The audio channels include distributed audio channels (C, LF, RF, LS, RS, LR, RR) and an LFE channel. The distributed audio channels are provided to a separation section 804 included in the bass converter 202. The separation section 802 includes both the high pass filter bank 702 and the low pass filter bank 706 to separate the audio content on each respective audio channel into a low frequency range and a high frequency range. Together the low frequency range and the high frequency range represent the entire range of frequency and energy of the audio content on the respective audio channel. In one example, the low pass and high pass filtering may be performed with a second order Linkwitz-Riley filter operating at the predetermined tunable bass center frequency, such as about 80 Hz. In other examples, other second order filters, higher order filters or other types or combinations of filters or signal processing may be employed, such as finite impulse response (FIR) filtering to accomplish a similar result. In addition, other predetermined tunable center frequencies may be used, such as anywhere in a range from about 50 Hz to about 300 Hz.

In the separation section 804, the LFE channel is subject to an all pass filter (AP0) 806 included in the gain stage and all pass filter bank 704 to maintain phase with the distributed audio channels. In an attenuation section 808 of the bass converter 202, a gain stage 810 included in the gain stage and all pass filter bank 704 is included that divides the LFE channel in half such that a first half of the LFE signal and a second half of the LFE signal are formed. Each half of the LFE signal includes half of the energy of the audio content, but the full range of frequency of the audio content present on the LFE channel. The center channel also includes an attenuation stage 812 that similarly divides the energy of the audio content on the center channel in half to form first and second halves of the center channel having the full range of frequency of the audio content of the center channel.

The rest of the distributed audio channels (such as LF, RF, LS, RS, LR, RR channels) each have a respective gain stage 812 operable in the first gain stage module 708. The respective gain stages may be synchronously operated as previously discussed. In one example, the gain stages may be strategically grouped into different gain stage groupings. In FIG. 8, a center gain stage 814 is grouped with a right front gain stage 816 and a left front gain stage 818 to form a front gain control group 820 for the front and center channels. In addition, a left side gain stage 824 is grouped with a right side gain stage 826 to form a side gain control group 828 of the side channels. Also, a left rear gain stage 832 is grouped with a right rear gain stage 834 to form a rear gain control group 836 of the rear channels. In other examples, other groupings are possible.

During operation, a gain control of a respective one of the gain control groups is adjusted to attenuate the audio channels in the group, the gain stages of the audio channels in one or more of the other groups may be corresponding increased. For example, where the gain values (F) of the gain stages in the front gain control group 820 are controlled with a gain control value (CF), the gain values (S) in the gain stages of the side gain control group 828 are controlled with a gain control value (CS), and the gain values (B) in the rear gain control group 836 are controlled with a gain control value (CB), the gain values, expressed in terms of linear gain values, may cooperatively change based on:

$$F=\text{lin}(CF)/(3*\text{lin}(CF))+(2*\text{lin}(CS))+(2*\text{lin}(CB)) \quad \text{Equation 1}$$

$$S=\text{lin}(CS)/(3*\text{lin}(CF))+(2*\text{lin}(CS))+(2*\text{lin}(CB)) \quad \text{Equation 2}$$

$$B=\text{lin}(CB)/(3*\text{lin}(CF))+(2*\text{lin}(CS))+(2*\text{lin}(CB)) \quad \text{Equation 3}$$

where $\text{lin}(x)=10^{x/20}$.

In FIG. 8, a left and right sum section 840 includes a left summer 842 and a right summer 844 that are part of the mono/stereo balance module 710. The left summer 842 may receive the first half of the LFE channel audio content, a low frequency part of the first half of the center channel audio content and a low frequency part of the audio content of the left side audio channels (LF, LS, LR). The right side summer 844 may receive the second half of the LFE channel audio content, a low frequency part of the half of the center channel audio content and a low frequency part of the audio content of the right side audio channels (RF, RS, RR). The left summer 842 may generate the left side blended audio signal, and the right summer 844 may generate the right side blended audio signal, each of which are the routed bass audio content.

A left and right bass section 848 of the bass converter 202 may be included in the second gain stage module 712. A plurality of gain stages in the left right bass section 848 may be grouped as left into left, right into right gain stages (LL) 852 and left into right, right into left gain stages (LR) 854 such that the amount of left and right side blended audio signal made available on the audio channels may be adjusted. For example, where the gain stages are either an LL gain value or an LR gain value, the following may be used to control the gain values LL and LR, where M % is the desired percentage of a mono routed bass audio signal:

$$LL=1/(1+M\%) \quad \text{Equation 4}$$

$$LR=1-LL \quad \text{Equation 5}$$

As a result, of the relationship of the right side blended audio signal and the left side blended audio signal, a predetermined percentage anywhere between 0 and 100% of each of the left and right side blended audio signals may be provided on each of the distributed audio signals as the routed bass audio content. Due to Equations 4 and 5, the percentage of the right side blended audio signal being supplied to the right side distributed audio channels will be that percentage of the right side blended audio signal not being supplied to the left side distributed audio channels. In addition, the combination of the percentages of the left and right side blended audio signals being supplied to both the right and left side audio channels as the routed bass audio content may each be 100%.

An output sum section 858 of the bass converter 202 may be included in the summer module 714. The output sum section 858 may include a plurality of summers 860. Each of the summers 860 may represent a corresponding distributed control channel. Accordingly, each of the summers 860 receives a high frequency part of the audio content on that respective channel (un-routed spatial audio content), a percentage of the right side blended audio signal (base audio content) and a percentage of the left side blended audio signal (base audio content). The percentages of each of the right side blended audio signal and the left side blended audio signal are dependent on the gain values in second gain stage module 712. The output of the summers 862 may be to the adapted distributed control channels in an output section 862 of the bass converter 202. The LFE channel has been eliminated (if present) by routing the audio content of the LFE channel to be distributed among one or more of the adapted distributed audio channels.

Figure 9:
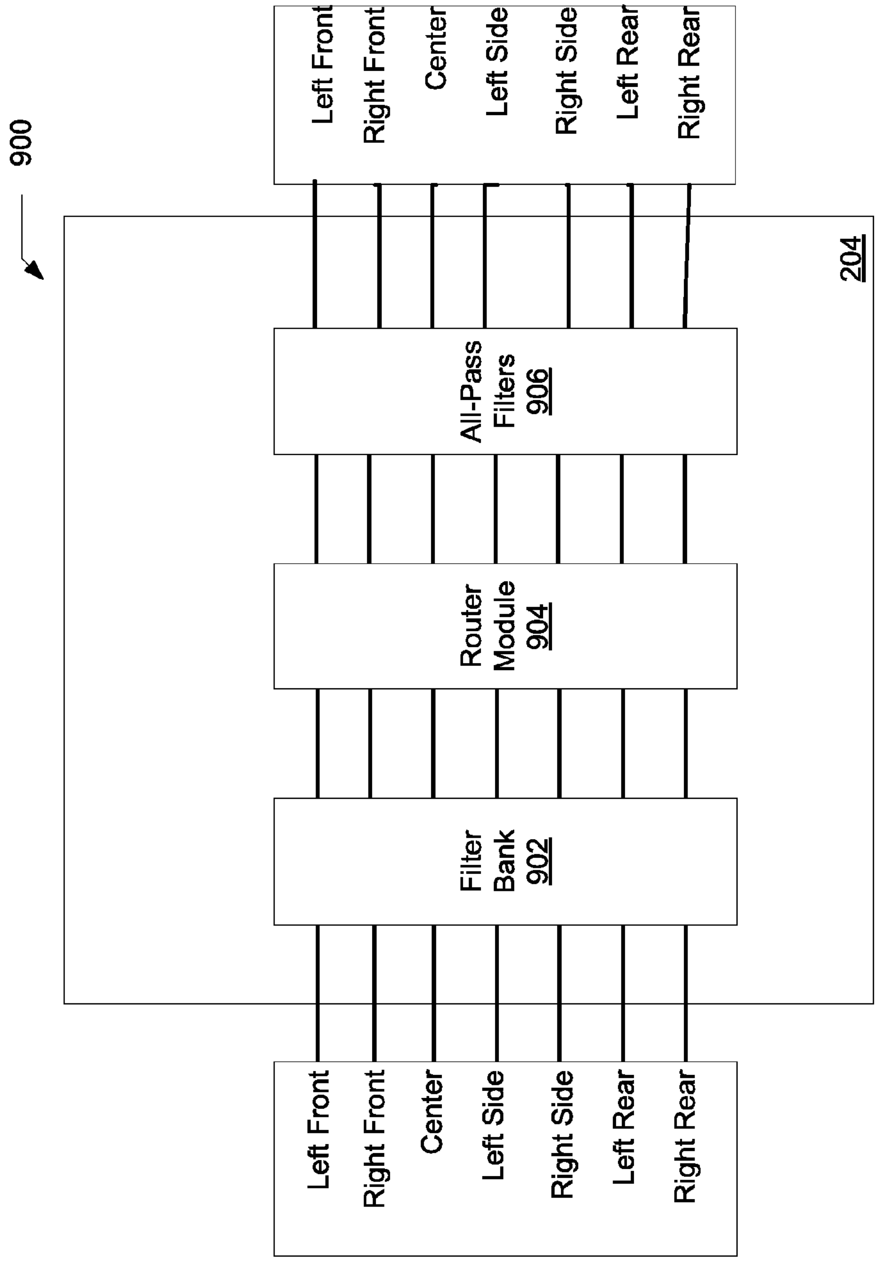
FIG. 9 is an example block diagram of the bass router of FIG. 2.

FIG. 9 is an example block diagram 900 of the bass router 210 of FIG. 2 that is included as part of the distributed channel audio content router 204. Only the distributed audio channels, such as LF, RF, C, LS, RS, LR, RR channels are received by the bass router 210. Each of the distributed audio channels may be subject to filtering with a filter bank 902 that includes high-pass, low-pass, and all-pass filtering. The high pass, low pass, all-pass filter bank 902 may selectively divide the audio content on some of the distributed audio channels into a high frequency range and a low frequency range, or phase adjust audio content on a respective one of the audio channels, before processing by the audio router module 904.

In one example, the low pass and high pass filtering may be performed with a second order Linkwitz-Riley filter operating at the predetermined tunable mid-bass center frequency, such as about 400 Hz. In other examples, other second order filters, higher order filters or other types or combinations of filters or signal processing may be employed, such as finite impulse response (FIR) filtering to accomplish a similar result. In addition, other predetermined tunable center frequencies may be used, such as anywhere in a range from about 40 Hz to about 400 Hz.

The audio router module 904 may selectively route the low frequency portion of the audio content (mid-bass audio content) from one of the distributed audio channels to one or more other of the distributed audio channels based on predetermined settings or operational changeable parameters of the AES 102. Thus, the bass router 210 may, for example, access system specific configuration information, operational parameters, and/or operational characteristics of the loudspeakers to determine if the low frequency portion of one or more of the audio channels should be re-routed. Alternatively, or in addition, the bass router 210 may be pre-configured by a designer of the AES 102 or configured during operation by a user of the AES 102 to route at least some low frequency portions of audio content from one distributed audio channel to one or more other distributed audio channels.

The high or low frequency portions of distributed audio channels output from the audio router module 904 may be selectively filtered with a filter bank of all-pass filters 906. The purpose of selectively passing the high or low frequency portions of the distributed audio channels output from the audio router module 904 through the filter bank containing a set of all-pass filters 906 is to selectively perform phase alignment. The resulting phase aligned high or low frequency portions of the distributed audio channels may then be combined to form distributed audio channels, and the adapted distributed audio channels (LF, RF, C, LS, RS, LR, RR) may be output from the bass router 210.

Figure 10:
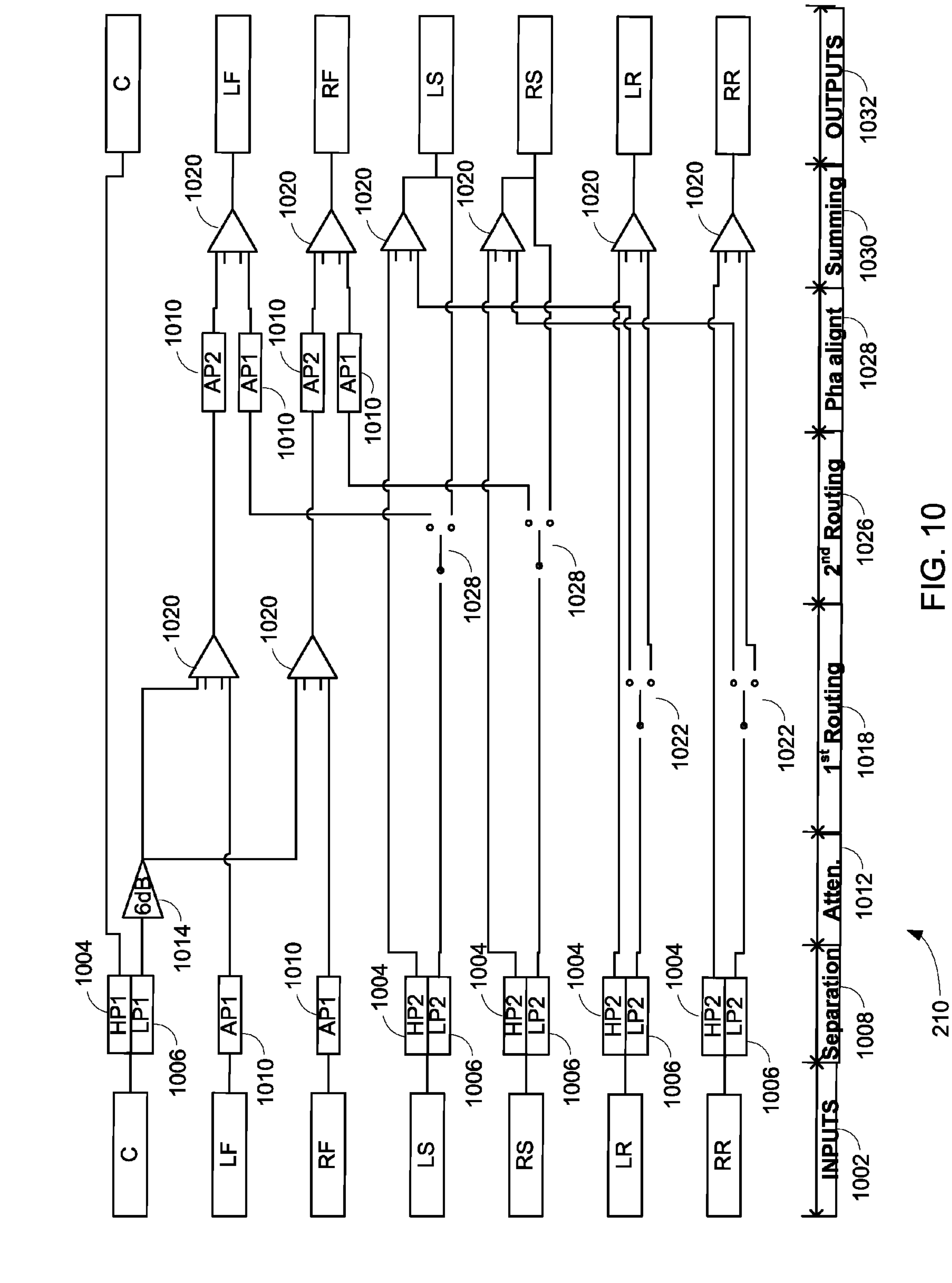
FIG. 10 is a more detailed example block diagram of the bass router of FIG. 2 and FIG. 9.

FIG. 10 is an example more detailed configuration of the bass router 210. In FIG. 10, the center, left side, right side, left rear and right rear distributed audio channels received in an inputs section 1002 may be subject to the filter bank 902 having high pass (HP) filters 1004 and low pass (LP) filters 1006 within a separation section 1008 of the bass router 210 to divide or separate the audio content on a respective audio channel into a low frequency portion and a high frequency portion. Also within the separation section 1008, the left front and right front distributed audio channels may be subject to an all pass (AP) filter 1010 included in the filter bank 902 to maintain the audio content on the left front and right front audio channels in phase alignment with the audio content subject to high pass and low pass filtering on the other audio channels. In other examples, the distributed audio channels subject to high pass, low pass and all pass filtering may be different, dependent on the AES 102.

In an attenuation section 1012 included in the router module 904 of the bass router 210, the low frequency portion of the audio content present on the center channel (mid-bass audio content) may be subject to attenuation, such as −6 dB, with a gain stage 1014 to divide the mid-bass audio content in half. Due to processing with the bass converter 202, the center channel may include routed bass audio content as well as higher frequency un-routed spatial audio content that was present on the center channel when received by the spectral management system 130. In a first re-routing section 1018 included in the router module 904, each halved low frequency mid-bass audio content from the center channel may be summed with the audio content included on the left front channel and the right front channel by summers 1020. The audio content being summed is phase aligned due to the low frequency part of the center channel being phase shifted with a low pass filter 1006, and the audio content of the left front and right front audio channels being similarly phase shifted by an all pass filter 1010.

Also within the first routing section 1018, the low frequency portion of the audio content (mid-bass content) on the left and right rear channels may be selectively routed to other audio channels by rear switches 1022. In FIG. 10, the low frequency mid-bass audio content on the left and right rear channels may be selectively routed to the left and right side channels, respectively. The rear switches 1022 may be switched between a first position to keep the low frequency mid-bass audio content on the respective right and left rear audio channels, and a second position to re-route the low frequency mid-bass audio content to the left and right side audio channels, respectively. The position of the rear switches

1022 may be based on predetermined settings or operational changeable parameters of the AES 102. In other examples, the rear switches 1022 may include more than two switch positions, or may otherwise selectively route the low frequency mid-bass content of the left and right rear channel audio content to any other distributed audio channels.

In a second routing section 1026 included in the router module 904, side switches 1028 may similarly selectively route a low frequency part of the audio content (mid-bass audio content) on the left and right side channels to the left and right front channels, respectively. Switching of the side switches 1028 may be based on predetermined settings or operational changeable parameters of the AES 102, such as a user setting and/or loudspeaker operational capabilities. In other examples, the side switches 1028 may include more than two switch positions, or may otherwise selectively route the low frequency mid-bass audio content of the left and right audio content to any other distributed audio channels. In a phase alignment section included in the all pass filter bank 906 of the bass router 210, the audio content output from the summers 1020 consisting of the left or right front audio content combined with the low frequency portion of the audio content (mid-bass audio content) from the center channel, and the low frequency portion of the audio content (mid-bass audio content) from the left and right side audio channels may be phase aligned with all pass filters 1010.

In a summing section 1030 of the bass router 210, the low frequency portions of the audio content (mid-bass audio content) from at least some of the distributed audio channels may be combined with the audio content on other audio channels by summers 1020. In FIG. 10, the low frequency mid-bass content from the left and right side channels may be combined with the remaining audio content on the left or right front channels combined with the mid-bass audio content from the center channel. In addition, the low frequency mid-bass audio content from the left and right rear channels may be combined with the audio content remaining on the left and right side channels, respectively.

The resulting adapted distributed audio channels containing the re-routed audio content may be provided in an output section 1032. Although the low frequency range of audio content on the distributed audio channels has been separated, selectively re-routed and recombined with audio content on other audio channels, the totality of the audio content included in the audio signal remains unchanged. In addition, the same number of distributed audio channels received by the bass router 210 are output by the bass router as adapted distributed audio channels. Thus, no part of the audio signal has been removed, and no audio content has been added to the audio signal.

Figure 11:
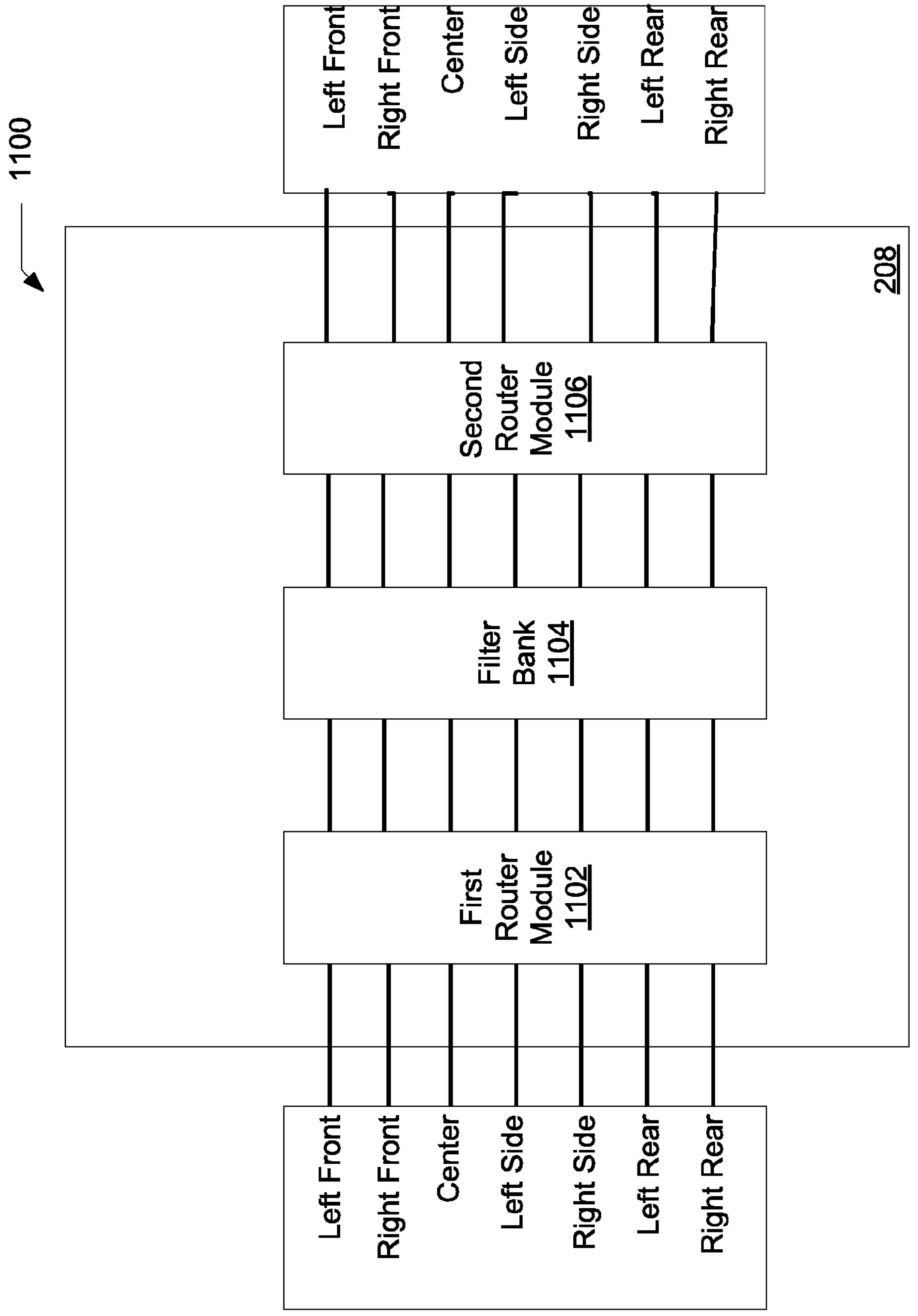
FIG. 11 is an example block diagram of the treble router of FIG. 2.

FIG. 11 is an example block diagram 1100 of the treble router 208 that is included as part of the other distributed channel audio content router 204. The treble router 208 may receive the distributed audio channels and processes them with a first router module 1102. The first router module 1102 may determine if any of the distributed audio channels may bypass a filter bank 1104 included in the treble router 208. The decision to bypass the filter bank 1104 with selected distributed audio channels may be based on predetermined settings or operational changeable parameters of the AES 102, such as the frequency response or placement of loudspeakers being driven by the respective audio channels. The filter bank 1104 may be made up of high pass and low pass filters to separate the audio content on a particular audio channel into a high frequency part and a low frequency part using the predetermined tunable treble center frequency. In one example, the low pass and high pass filtering may be performed with a second order Linkwitz-Riley filter operating at the predetermined tunable treble center frequency, such as about 4000 Hz. In other examples, other second order filters, higher order filters or other types or combinations of filters or signal processing may be employed, such as finite impulse response (FIR) filtering to accomplish a similar result. In addition, other predetermined tunable center frequencies may be used, such as anywhere in a range from about 2000 Hz to about 8000 Hz.

The high frequency part (treble audio content) of the distributed audio channels may be routed to one or more other distributed audio channels with a second router module 1106 included in the treble router 208. For example, the treble audio content part of the audio content on the center channel may be routed to the left and right front audio channels. The output from the second router module 1106 may provide the distributed audio channels with at least some of the treble audio content re-routed or re-distributed among the distributed audio channels. The output from the second router module 1106 may be the adapted distributed audio channels. The adapted distributed audio channels may be provided by the spectral management system 130 as the audio output signal.

Figure 12:
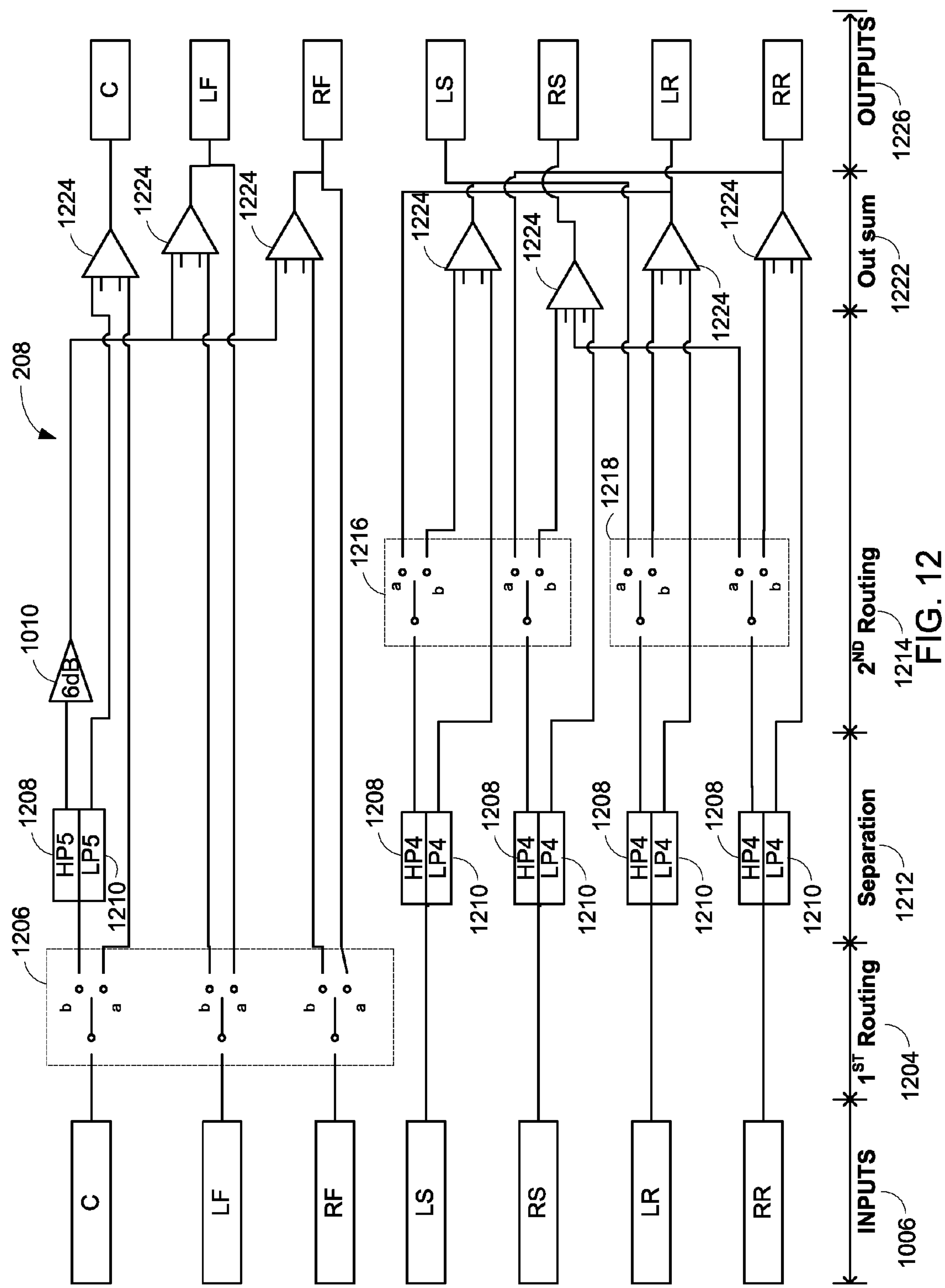
FIG. 12 is a more detailed block diagram of the bass router of FIG. 2 and FIG. 11.

FIG. 12 is a diagram of an example detailed configuration of the treble router 208 of FIG. 2 and FIG. 11. In FIG. 12, the distributed audio channels may be received at an input section 1202 of the treble router 208. In a first routing section 1204 included in the first routing module 1102, the center channel, the left front channel and the right front channel may be selectively routed with a center switch 1206. Switching of the center switch 1206 may be based on predetermined settings or operational changeable parameters of the AES 102. In FIG. 12, the position of the center switch 1206 may be based on whether a high frequency part of the audio content on the center audio channel should be routed to the left front and right front channels. Thus, when the center switch is in a first position (a), the audio content on the center channel remains on the center channel, and there is no combination of audio content from the center channel with the right and left channels. In a second switch position (b), the center channel is routed through a high pass filter 1208 and a low pass filter 1210 in a separation section 1212 of the filter bank 1104 of the treble router 208. In addition, the audio content of the left and right front channels are routed to summers as described later.

Also in the separation section 1212 of the treble router 1212, the audio content on the left side, right side, left rear, and right rear audio channels may be separated into low and high frequency parts by respective high pass filters 1208 and low pass filters 1210. The separation of the high frequency part from the low frequency part may be performed with a second order Linkwitz-Riley filter operating at the predetermined tunable treble center frequency, such as about 4000 Hz. In other examples, other second order filters, higher order filters or other types or combinations of filters or signal processing may be employed, such as finite impulse response (FIR) filtering to accomplish a similar result. In addition, other predetermined tunable center frequencies may be used, such as anywhere in a range from about 2000 Hz to about 8000 Hz.

In a second routing section 1214 included in the second router module 1106, a side switch 1216 and a rear switch 1218 may control routing of the high frequency part (the treble audio content) of the respective side channels and rear channels. Switching of the side switch 1214 and the rear switch 1216 may be based on predetermined settings or operational changeable parameters of the AES 102, such as user settings and/or loudspeaker operational capabilities. In other examples, additional switches, additional switch positions, or a combination of both may be used to perform selective separation and routing of the treble audio content portion of one or more of the distributed audio channels.

In FIG. 12, the side switch 1216 may route the treble audio portion of the audio content included on the left and right side channels to the left and right rear channels, respectively, when positioned in a first position (a). In a second position (b) the high frequency part of the audio content may remain on the side channels. Thus, the first position(a) may be used when, for example, the range of frequency response of the loudspeakers being driven by the audio content on the side channels cannot efficiently accommodate the high frequency portion of the audio content based on the predetermined tunable center treble frequency control. The rear switch 1218 may be placed in a first position (a) to route the treble audio content include on the left and right rear audio channels to the left and right side audio channels, respectively. In a second position (b), the rear switch 1218 maintains the high frequency portion of the audio content on the left and right rear audio channels. Thus, the first position (a) may be used when, for example, the range of frequency response of the loudspeakers being driven by the audio content on the rear channels cannot efficiently accommodate the high frequency portion of the audio content based on the predetermined tunable center treble frequency control.

In a summer section 1222 included in the second router module 1106 of the treble router 208, a plurality of summers 1224 may be included to combine the separated treble audio content with audio content still present on the distributed audio channels. For example, the treble audio content separated from the center channel which has been halved may be combined with the audio content present on both the left front channel and the right front channel. In another example, the treble audio content separated from the left side channel and the right side channel may be combined with the audio content present on the left rear channel and the right rear channel, respectively. Alternatively, or in addition, the summers 1224 may recombine the high frequency part of the audio content and the low frequency part of the audio content from the same audio channel, such as when the side and rear switches are in the second position (b). Due to the range of frequency of the separated treble audio signals, phase alignment prior to combination with the audio content present on an audio channel may be omitted, even when phase misalignment is present due to limitations on human hearing capability. Alternatively, phase alignment may be implemented prior to combination. The outputs of the summer section 1222 may be provided as the adapted distributed audio output channels in an output section 1226 of the treble router 208. In other examples, any other type of re-routing of the high frequency part of one or more audio channels may be performed with the treble, router 208 based on the predetermined tunable center frequency.

Figure 13:
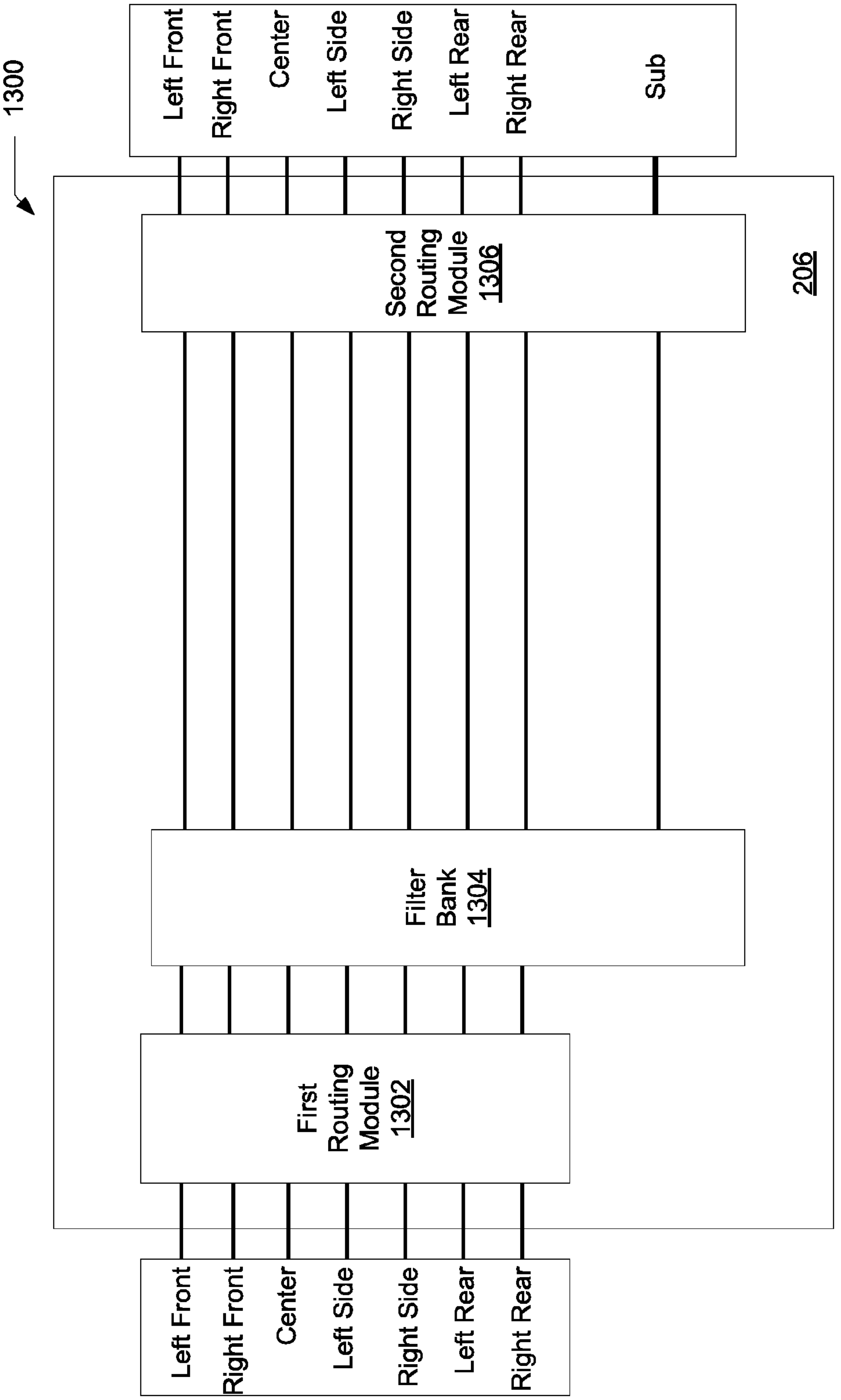
FIG. 13 is an example block diagram of the subwoofer router of FIG. 2.

FIG. 13 is a block diagram 1300 of the subwoofer router 206 of FIG. 2. The distributed audio channels may be received by the subwoofer router 206 and processed by a first routing module 1302. The audio channels may be routed by the first routing module to a filter bank 1304 of high pass filters and low pass filters, or routed to bypass the filter bank 1304 of high pass filters and low pass filters. The filter bank 1304 of high pass filters and low pass filters may be bypassed when separation and routing of a low frequency part of the audio content on a distributed audio channel is not needed. The audio content of those audio channels passed to the filter bank 1304 of high pass filters and low pass filters by the first routing module 1302 may be separated into a low frequency part and a high frequency part. The high frequency part and low frequency part (sub audio content) of the audio channels from the filter bank 1304 are then passed to a second routing module 1306. Within the second routing module 1306, the sub audio content of at least some of the distributed audio channels may be used to generate the sub channel. In addition, the adapted distributed audio channels may be formed. The adapted distributed audio channels and the sub channel may then be used to drive respective loudspeakers in the AES 102.

Figure 14:
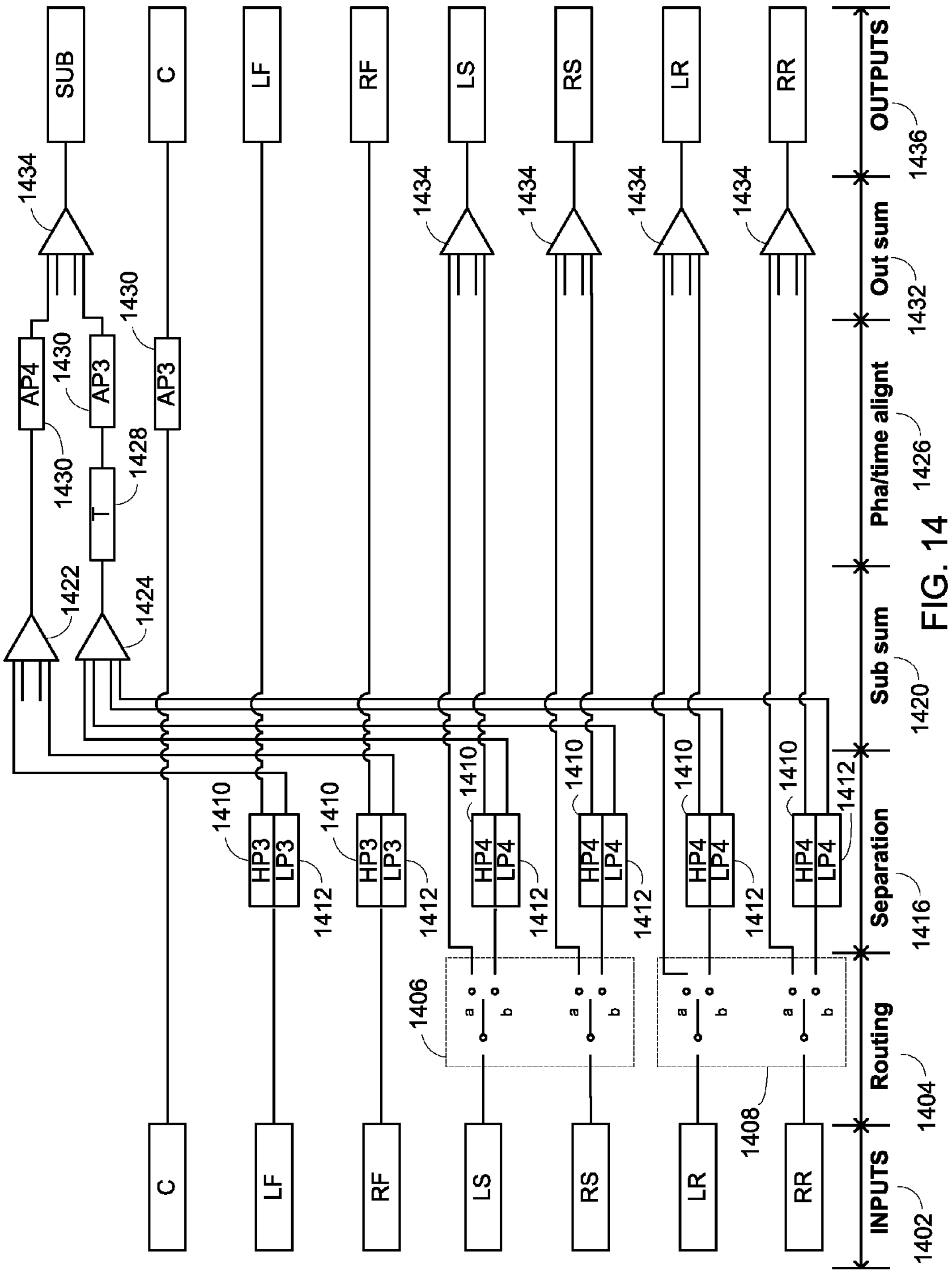
FIG. 14 is a more detailed block diagram of the subwoofer router of FIG. 2 and FIG. 9.

FIG. 14 a diagram of an example detailed configuration of the subwoofer router 206 of FIG. 2 and FIG. 13. In FIG. 14, the distributed audio channels may be received at an input section 1402 of the subwoofer router 206. A first routing section 1404 included in the first router module 1302 may include a side bypass switch 1406 and a rear bypass switch 1408 for selectively routing audio content on the left and right side channels and the left and right rear channels, respectively. Switching of the side bypass switch 1406 and the rear bypass switch 1408 may be based on predetermined settings or operational changeable parameters of the AES 102, such as a user setting and/or loudspeaker operational capabilities. In other examples, additional switches, additional switch positions, or a combination of both may be used to perform selective bypass routing of any number of the distributed audio channels.

In FIG. 14, the position of the side bypass switch 1406 may be based on whether a low frequency part of the audio content on the left and right side audio channels can be used to drive loudspeakers associated with the left and right side audio channels. Thus, when the side bypass switch 1406 is in a first position (a), the entirety of the audio content on the left and right side channels remain on the left and right side channels. In a second switch position (b), the audio content on the left and right side audio channels is routed through a high pass filter 1410 and a low pass filter 1412 contained in the filter bank 1304 in a separation section 1416 of the subwoofer router 206. In addition, the audio content of the left and right front channels are routed through the high pass filter 1410 and the low pass filter 1412 in a separation section 1416.

Within the separation section 1416, the audio content on the left front, right front, left side, right side, left rear, and right rear audio channels may be selectively separated into low and high frequency parts by respective high pass filters 1410 and low pass filters 1412. The separation of the high frequency part from the low frequency part (sub audio content) may be performed with a second order Linkwitz-Riley filter operating at the predetermined tunable subwoofer center frequency, such as about 80 Hz. In other examples, other second order filters, higher order filters or other types or combinations of filters or signal processing may be employed, such as finite impulse response (FIR) filtering to accomplish a similar result. In addition, other predetermined tunable center frequencies may be used, such as anywhere in a range from about 40 Hz to about 200 Hz.

In a sub summing section 1420 included in the second router module 1306, the low frequency parts of the audio content separated from one or more of the distributed audio channels from the left side and the right side may be separately combined with a right summer 1422 and a left summer 1424. In FIG. 14, the left summer 1422 receives the low pass part of the audio content from the left front channel, and may also receive the low frequency part of the left side channel and the left rear channel depending on the position of the side bypass switch 1406 and the rear bypass switch 1408 to form a left side sub audio content. The right summer 1424 receives the low pass part of the audio content from the right front channel, and may also receive the low frequency part of the right side channel and the right rear channel depending on the position of the side bypass switch 1406 and the rear bypass switch 1408 to form left side sub audio content. In other examples, any other configuration of the sub audio content separated from the distributed audio channels may be summed by the right and left summers 1422 and 1424. A summed left sub audio content may be supplied by the left summer 1422 and a summed right sub audio content may be supplied by the right summer 1424.

In a phase alignment section 1426 included in the second routing section 1306, phase adjustment with an all pass filter 1430 and time delay with a time delay 1428 may be applied to the summed left low frequency audio content and the summed right low frequency audio content. In FIG. 14, the summed left low frequency audio content and the summed right low frequency audio content is phase adjusted with an all pass filter 1430. In addition, the audio content on the center channel is phase adjusted with the all pass filter 1430 to maintain phase alignment with the other distributed audio channels. In a summation section 1432 of the second routing section 1306, a summer 1434 may combine the summed left low frequency audio content with the summed right low frequency audio content to form the sub channel. An output section 1436 of the subwoofer router 206 may output the sub channel and the distributed channels (R, L, C, RS, LS, LR, RR).

Figure 15:
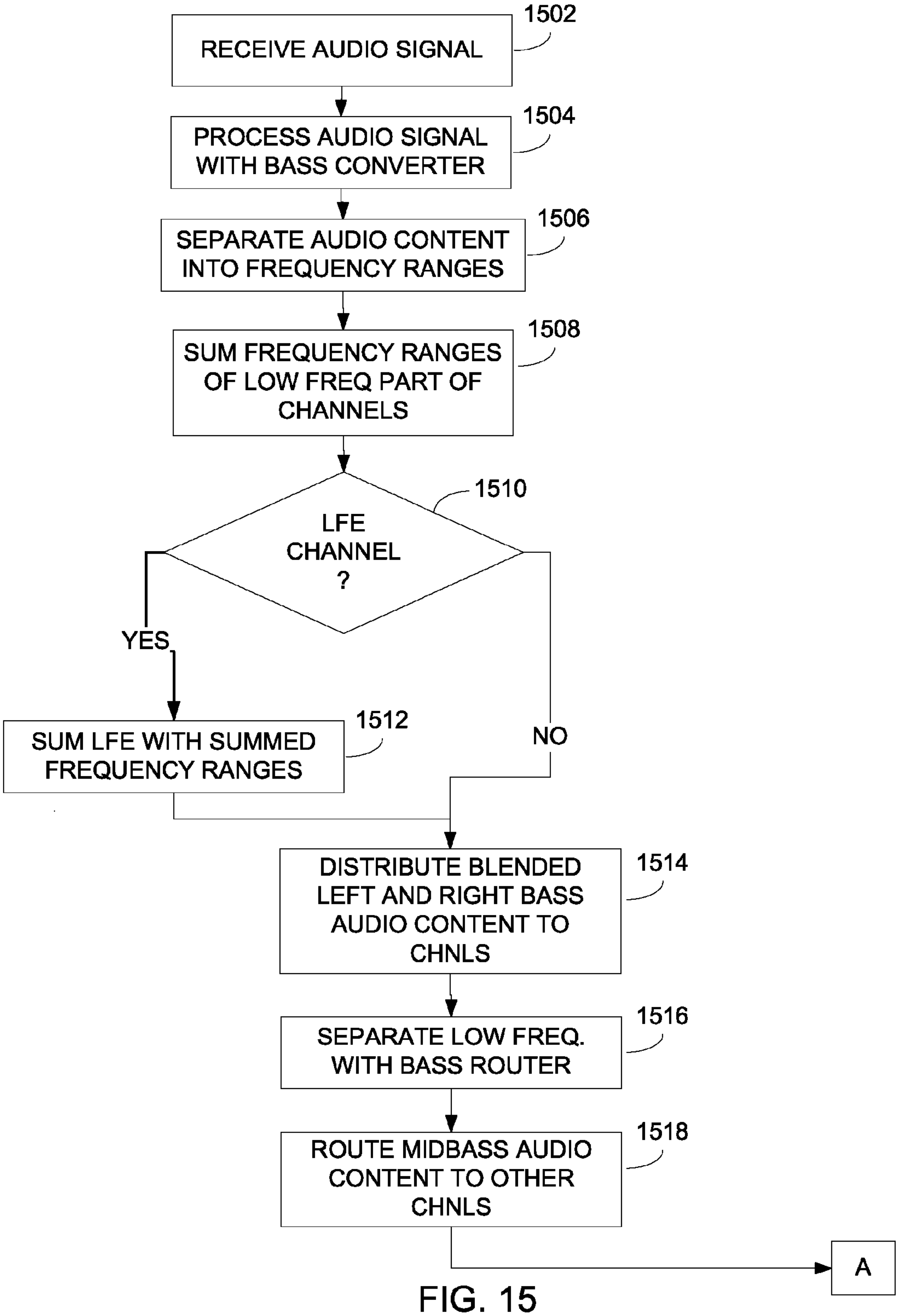
FIG. 15 is an example operational flow diagram of the spectral management system of FIGS. 1-14.

FIG. 15 is an example operational flow diagram of the spectral management system 130 described with reference to FIGS. 1-14. The spectral management system 130 receives an audio signal having at least two audio channels (e.g., left and right audio channels) at block 1502. At block 1504, the received audio channels are processed by the bass converter 202. The bass converter 202 separates a low frequency part of the audio content from a high frequency part of the audio content on one or more of the distributed audio channels with a high pass and low pass filter bank based on a predetermined tunable bass center frequency at block 1506. The separated low frequency portions of each of the distributed audio channels are summed to form a right blended bass audio signal and a left blended bass audio signal at block 1508.

At block 1510, it is determined if the audio signal includes an LFE channel. If the audio signal includes an LFE channel, at block 1512, the audio content on the LFE signal is divided in half, and half of the LFE channel audio content is combined with each of the right blended bass audio signal and the left blended bass audio signal. The right and left blended bass audio signals are distributed as routed audio bass content to the distributed audio channels at block 1514 in such a manner to provide the routed audio bass content included in the distributed audio channels in mono (0%) or in a level of stereo between 1% and 100%. If, at block 1510, the input audio signal does not include an LFE channel, the operation proceeds directly to block 1514.

Figure 16:
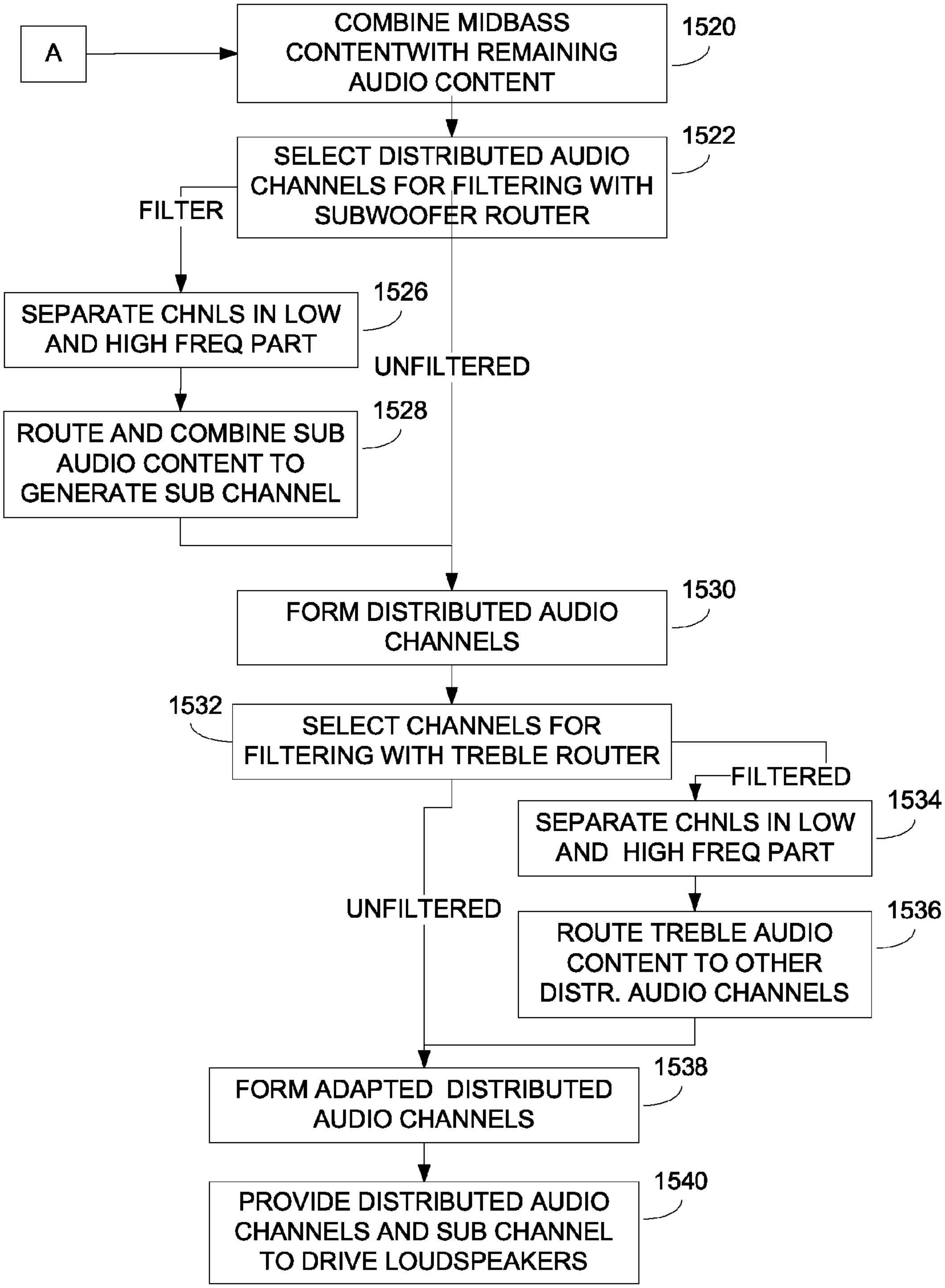
FIG. 16 is a second part of the operational flow diagram of FIG. 15.

At block 1516 at least some of the adapted distributed audio channels received from the bass converter 202 are processed by the distributed channel audio content router 204, and more specifically by the bass router 210 to separate a low frequency part of the audio content (mid-bass audio content) from a high frequency part of the audio content based on a predetermined tunable mid-bass center frequency. The mid-bass audio content is re-routed to other distributed audio channels at block 1518 based on predetermined settings or operational changeable parameters of the AES 102. In FIG. 16, the mid-bass audio content are combined with audio content remaining on the distributed audio channels at block 1520. At block 1522, at least some of the adapted distributed audio channels received from the bass router 210 by the subwoofer router 206, are selected for filtering to route the low frequency portion of the audio content based on predetermined settings or operational changeable parameters of the AES 102. The distributed audio channels selected for filtering are separated into a low frequency part of the audio content and a high frequency part of the audio content based on a predetermined tunable sub center frequency at block 1526. At block 1528, the sub channel is generated by the subwoofer router 206 by routing and combining the separated sub audio content to form the sub channel. The distributed channels are formed from the remainder of the audio content and any unfiltered audio content by the subwoofer router 206 at block 1530.

The distributed channels and the sub channel are supplied to the distributed channel audio content router 204 and more specifically to the treble router 208 from the subwoofer router 206 at block 1532, and at least some of the distributed audio channels are selected for filtering to route the high frequency portion of the audio content based on predetermined settings or operational changeable parameters of the AES 102. The distributed audio channels selected for filtering are separated into a high frequency part of the audio content (treble audio content) and a low frequency part of the audio content based on a predetermined tunable treble center frequency at block 1534. At block 1536, the treble audio content from one or more of the audio channels is routed to other audio channels based on predetermined settings or operational changeable parameters of the AES 102. The distributed audio channels are formed to include the re-routed high frequency portions and any unfiltered audio content on the distributed audio channels at block 1538. At block 1540, the adapted distributed audio channels and the sub channel are supplied by the spectral management system 130 to drive loudspeakers coupled with the respective audio channels.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A spectral management system, comprising:

a bass converter configured to receive an input audio signal comprising a plurality of distributed audio channels, the bass converter executed by a processor to separate a first range of frequency of audio content included in at least some of the distributed audio channels and sum the first range of frequencies to form routed audio bass content, the bass converter further executed to route and combine the routed audio bass content with audio content present on at least some of the distributed audio channels, and to form adapted distributed audio channels, at least some of the adapted distributed audio channels including the routed audio bass content; and a distributed channel audio content router executed by the processor to separate and route a second frequency range of audio content from at least a first one of the adapted distributed audio channels to at least a second one of the adapted distributed audio channels, and combine the second frequency range of audio content with audio content present on the at least the second one of the adapted distributed audio channels;

the adapted distributed audio channels, including the first one of the distributed audio channels and the second one of the distributed audio channels, made available to drive a plurality of loudspeakers.

2. The spectral management system of claim 1 further comprising a subwoofer router executed by the processor to selectively separate and route a third frequency range of audio content from at least some of the adapted distributed audio channels to create a sub channel.

3. The spectral management system of claim 1, where the bass converter includes a gain stage module configured to attenuate by a first determined amount the summed first frequency range of audio content combined with audio content of a first distributed channel and attenuate by a second determined amount the summed first frequency range of audio content combined with audio content of a second distributed channel.

4. The spectral management system of claim 1, where the summed first frequency range of audio content comprises a left blended low frequency audio signal and a right blended low frequency audio signal, the left and right blended low frequency audio signals formed from audio content of a plurality of respective left and right distributed audio channels included in the distributed audio channels.

5. The spectral management system of claim 4, where the left and right blended audio signals summed with the remaining audio content present on the distributed audio channels may be attenuated at different ratios to create a mono routed bass audio signal or a stereo routed bass audio signal with the adapted distributed audio channels.

6. The spectral management system of claim 1, where the distributed channel audio content router comprises at least one of a bass router and a treble router, and the second predetermined frequency range of audio content comprises a mid-bass audio content and a treble audio content, the bass router executed to separate out, route, and combine the mid-bass audio content, and the treble router executed to separate out, route, and combine the treble audio content.

7. The spectral management system of claim 1, where the first frequency range and the second frequency range are established based on a different predetermined tunable center frequency of at least one respective second order filter included in each of the bass router and the distributed channel audio content router.

8. The spectral management system of claim 1, where a number of distribute audio channels included in the input audio signal are equal to a number of distributed audio channels included in an output audio signal provided by the spectral management system to drive a plurality of respective loudspeakers.

9. A method of spectral management of a multi-channel audio signal, the method comprising:

receiving with a bass converter executed by a processor an input audio signal comprising a plurality of distributed audio channels;

separating and summing a first frequency range of audio content received on at least some of the distributed audio channels with the bass converter;

with the bass converter, combining the summed first frequency range of audio content with the remaining audio content present on at least some of the distributed audio channels;

forming adapted distributed audio channels, at least some of which include the summed first frequency range of audio content;

separating and routing a second frequency range of audio content from a first one of the adapted distributed audio channels to a second one of the adapted distributed audio channels with a distributed channel audio content router executed by the processor;

combining the second frequency range of audio content with audio content present on the second one of the adapted distributed audio channels with the distributed channel audio content router; and making available the adapted distributed audio channels, including the first one of the adapted distributed audio channels and the second one of the adapted distributed audio channels, to drive a plurality of loudspeakers.

10. The method of claim 9, further comprising maintaining a number of the distributed audio channels equal to a number of the adapted distributed audio channels.

11. The method of claim 9, where separating and routing the second frequency range of audio content from the first one of the adapted distributed audio channels to the second one of the adapted distributed audio channels comprises the further step of determining that a first loudspeaker coupled with the second one of the adapted distributed audio channels is optimized to be driven with the second frequency range of audio content than a second loudspeaker coupled with the first one of the adapted distributed audio channels.

12. The method of claim 9, where the second one of the adapted distributed audio channels comprises a right channel and a left channel, and separating and routing a second frequency range of audio content from a first one of the adapted distributed audio channels to a second one of the adapted distributed audio channels comprises dividing the second frequency range of the audio content in half and routing a first half of the second frequency range of the audio content to the right channel and a second half of the second frequency range of the audio content to the left channel.

13. The method of claim 12, where the first one of the adapted distributed audio channels comprises a center channel and separating and routing a second frequency range of audio content from a first one of the adapted distributed audio channels to a second one of the adapted distributed audio channels comprises maintaining a remaining frequency range of the audio content on the center channel to drive a center channel loudspeaker.

14. The method of claim 9, where the summed first frequency range of audio content comprises a right blended bass audio signal and a left blended bass audio signal, and combining the summed first frequency range of audio content with the remaining audio content present on the distributed audio channels comprises selectively attenuating the right blended bass audio signal and the left blended bass audio signal to create one of a mono routed bass audio content or a stereo routed bass audio content on the adapted distributed audio channels.

15. The method of claim 9, further comprising selectively separating and routing a third frequency range of audio content from at least some of the adapted distributed audio channels to generate a sub channel with a subwoofer router executed by the processor, the sub woofer channel made available, along with the adapted distributed audio channels, to drive the loudspeakers.

16. A spectral management system, comprising:

a processor;

a bass converter configured to receive an input audio signal comprising a plurality of distributed audio channels containing audio content;

the bass converter executed by the processor to separate a range of bass frequencies of the audio content included in at least some of the distributed audio channels and combine the range of bass frequencies to form audio bass content;

the bass converter further executed to route and combine the audio bass content with the audio content present on at least some of the distributed audio channels;

a distributed channel audio content router executed by the processor to process the plurality of distributed audio channels containing audio content at least some of which is combined with the audio bass content;

the distributed channel audio content router further executed to separate out a predetermined frequency range of the audio content included on a first one of the distributed audio channels;

the distributed channel audio content router further executed to route the separated predetermined frequency range of the audio content to both a second one of the distributed audio channels and a third one of the distributed audio channels to create adapted distributed audio channels having rearranged audio content.

17. The spectral management system of claim 16, where the predetermined frequency range is a first predetermined frequency range, and the distributed channel audio content router is further configured to separate a second predetermined frequency range of audio content included on a fourth one of the distributed audio channels and a fifth one of the distributed audio channels, and to route the separated predetermined frequency range of the audio content to a sixth one of the distributed audio channels and a seventh one of the distributed audio channels to create adapted distributed audio channels having rearranged audio content.

18. The spectral management system of claim 16, where the first one of the distributed audio channels is a center channel, the second one of the distributed audio channels and the third one of the distributed audio channels are a right front channel and a left front channel, respectively.

19. The spectral management system of claim 16, where the predetermined frequency range is a first predetermined frequency range, the spectral management system further comprising a subwoofer router executed by the processor to process at least some of the distributed audio channels to separate out a second predetermined frequency range of the audio content included on at least some of the distributed audio channels, the subwoofer router configured to generate a sub channel that includes only the separated second predetermined frequency range, a range of frequencies in the second predetermined frequency range less than a range of frequencies in the first predetermined frequency range.

20. The spectral management system of claim 16, where the distributed channel audio content router comprises a bass router and a treble router and the predetermined frequency range comprises a low frequency range and a high frequency range, the bass router executable by the processor to separate and route the low frequency range, and the treble router executable by the processor to separate and route the high frequency range.

21. The spectral management system of claim 16, where the audio channels comprise the distributed audio channels and a low frequency effects channel, and the bass converter is executable by the processor to route and combine audio content included on the low frequency effects channel with audio content included on the distributed audio channels.

22. A method of spectral management of a multi-channel audio signal, comprising:

separating a range of bass frequencies included in audio content of at least some of a plurality of distributed audio channels with a bass convertor, the bass converter being executed by a processor;

the bass converter combining the range of bass frequencies to form audio bass content;

routing and combining the audio bass content with the audio content present on the distributed audio channels with the bass converter;

executing a distributed channel audio content router with the processor;

processing the audio content of the distributed audio channels which include the audio bass content with the distributed channel audio content router being executed by the processor;

separating out a predetermined frequency range of the audio content included on a first one of the distributed audio channels with the distributed channel audio content router being executed by the processor;

routing the separated predetermined frequency range of the audio content to both a second one of the distributed audio channels and a third one of the distributed audio channels with the distributed channel audio content router being executed by the processor to create adapted distributed audio channels having rearranged audio content; and forming an output audio signal that includes the adapted distributed audio channels having rearranged audio content, the output audio signal available to drive loudspeakers.

23. The method of claim 22, further comprising maintaining a total energy level of audio content included in the input audio signal equal to a total energy level of audio content included in the output audio signal.

24. A spectral management system, comprising:

a bass converter executable with a processor to separate audio content received on each of a plurality of distributed audio channels into a first high frequency range of audio content and a first low frequency range of audio content based on a first predetermined tunable center frequency, the distributed audio channels comprising a plurality of left distributed audio channels and a plurality of right distributed audio channels;

the bass converter further executable with the processor to sum the first low frequency range of the audio content from the left distributed audio channels to form a left blended low frequency audio signal and to sum the first low frequency range of the audio content from the right distributed audio channels to form a right blended low frequency audio signal; and the bass converter further executable with the processor to combine the right blended low frequency audio signal with the high frequency range of audio content present on at least one of the right distributed audio channels and the left distributed audio channels, and to combine the left blended low frequency audio signal with the high frequency range of audio content present on at least one of the left distributed audio channels and the right distributed audio channels to form a plurality of adapted distributed audio channels.

25. The spectral management system of claim 24, further comprising a distributed channel audio content router executed by the processor to separate the audio content included on at least one of the adapted distributed audio channels into a second high frequency range of audio content and a second low frequency range of audio content based on a second predetermined tunable center frequency; and the distributed channel audio content router further executable to route and combine the second high frequency range of audio content or the second low frequency range of audio content with audio content present on the adapted distributed audio channels.

26. The spectral management system of claim 24, where the bass converter is further executable to receive a low frequency effect channel having audio content with the distributed audio channels, the bass converter further executable with the processor to sum half of the audio content included on the low frequency effect channel with the left blended low frequency audio signal and half of the audio content included on the low frequency effect channel with the right blended low frequency audio signal.

27. The spectral management system of claim 24, further comprising a subwoofer router executed with the processor to selectively separate a sub audio content from audio content included on one or more of the adapted distributed audio channels and form a sub channel that includes the separated sub audio content.

28. The spectral management system of claim 24, where a number of the distributed audio channels is equal to a number of adapted distributed audio channels.

29. A memory storage device having instructions stored thereon that are executable with a processor, the memory storage device comprising:

instructions to separate and sum a first frequency range of audio content received on each of a plurality of distributed audio channels;

instructions to combine the summed first frequency range of audio content with the remaining audio content present on the distributed audio channels to form adapted distributed audio channels;

instructions to separate and route a second frequency range of audio content from a first one of the adapted distributed audio channels to a second one of the adapted distributed audio channels;

instructions to combine the second frequency range of audio content with audio content present on the second one of the adapted distributed audio channels;

instructions to selectively separate and route a third frequency range of audio content from at least some of the adapted distributed audio channels to generate a sub channel; and instructions to make available the adapted distributed audio channels and the generated sub channel to drive a plurality of loudspeakers.

30. The memory storage device of claim 29, further comprising instructions to maintain a number of the distributed audio channels equal to a number of the adapted distributed audio channels.

31. The memory storage device of claim 29, where the instructions to separate and route the second frequency range of audio content from the first one of the adapted distributed audio channels to the second one of the adapted distributed audio channels comprises instructions to determine that a first loudspeaker coupled with the second one of the adapted distributed audio channels is better optimized to be driven with the second frequency range of audio content than a second loudspeaker coupled with the first one of the adapted distributed audio channels.

* * * * *